United States Patent
Yang et al.

(10) Patent No.: US 12,193,230 B2
(45) Date of Patent: Jan. 7, 2025

(54) THREE-DIMENSIONAL MEMORY DEVICE AND METHOD FOR FORMING THE SAME

(71) Applicant: YANGTZE MEMORY TECHNOLOGIES CO., LTD., Wuhan (CN)

(72) Inventors: Yuancheng Yang, Wuhan (CN); Bingjie Yan, Wuhan (CN); Di Wang, Wuhan (CN); Cuicui Kong, Wuhan (CN); Wenxi Zhou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 571 days.

(21) Appl. No.: 17/459,456

(22) Filed: Aug. 27, 2021

(65) Prior Publication Data
US 2022/0384474 A1   Dec. 1, 2022

Related U.S. Application Data

(63) Continuation of application No. PCT/CN2021/096722, filed on May 28, 2021.

(51) Int. Cl.
*H01L 27/11582* (2017.01)
*H10B 43/27* (2023.01)

(52) U.S. Cl.
CPC .................. *H10B 43/27* (2023.02)

(58) Field of Classification Search
CPC ........ H10B 43/27; H10B 41/27; H10B 43/35; H10B 41/00–70; H10B 43/00–50;
(Continued)

(56) References Cited

U.S. PATENT DOCUMENTS

| | | | |
|---|---|---|---|
| 9,679,907 B1 | 6/2017 | Kaneko | |
| 10,290,650 B1 | 5/2019 | Iwai | |
| 10,720,445 B1 | 7/2020 | Shimizu et al. | |
| 11,424,265 B2 * | 8/2022 | Rajashekhar | H10B 43/40 |

(Continued)

FOREIGN PATENT DOCUMENTS

| | | |
|---|---|---|
| CN | 102800695 A | 11/2012 |
| CN | 105390500 A | 3/2016 |

(Continued)

OTHER PUBLICATIONS

International Search Report issued in corresponding International Application No. PCT/CN2021/096722, mailed Feb. 25, 2022, 4 pages.

(Continued)

*Primary Examiner* — Shahed Ahmed
(74) *Attorney, Agent, or Firm* — BAYES PLLC

(57) ABSTRACT

A three-dimensional (3D) memory device includes a doped semiconductor layer, a stack structure, and a channel structure. The stack structure includes interleaved conductive layers and dielectric layers formed on the doped semiconductor layer. The conductive layers include a plurality of word lines, and a drain select gate line. The channel structure extends through the stack structure along a first direction and is in contact with the doped semiconductor layer. The drain select gate line includes a first dielectric layer in contact with the channel structure, and a first polysilicon layer in contact with the first dielectric layer.

20 Claims, 23 Drawing Sheets

(58) Field of Classification Search
CPC ... G11C 16/0408–0458; G11C 16/0466–0475; G11C 27/005; G11C 11/5671; H01L 29/792–7926; H01L 29/36–365
See application file for complete search history.

(56) References Cited

U.S. PATENT DOCUMENTS

| | | |
|---|---|---|
| 2008/0173933 A1 | 7/2008 | Fukuzumi et al. |
| 2016/0204122 A1 | 7/2016 | Shoji et al. |
| 2017/0229472 A1 | 8/2017 | Lu et al. |
| 2020/0395080 A1 | 12/2020 | Vishwanath et al. |
| 2021/0005617 A1* | 1/2021 | Kai .................. H10B 43/50 |
| 2021/0098490 A1 | 4/2021 | Or-Bach et al. |
| 2021/0159169 A1 | 5/2021 | Zhao et al. |
| 2022/0139960 A1* | 5/2022 | Said .................. H10B 51/30 257/295 |

FOREIGN PATENT DOCUMENTS

| | | |
|---|---|---|
| CN | 105810639 A | 7/2016 |
| CN | 107658302 A | 2/2018 |
| CN | 107996000 A | 5/2018 |
| CN | 108695338 A | 10/2018 |
| CN | 111354738 A | 6/2020 |
| CN | 111386608 A | 7/2020 |
| CN | 111508966 A | 8/2020 |
| WO | 2021/029916 A1 | 2/2021 |

OTHER PUBLICATIONS

International Search Report issued in corresponding International Application No. PCT/CN2021/096716, mailed Mar. 4, 2022, 4 pages.

* cited by examiner

THREE-DIMENSIONAL MEMORY DEVICE AND METHOD FOR FORMING THE SAME

CROSS-REFERENCE TO RELATED APPLICATIONS

This application is a continuation of International Application No. PCT/CN2021/096722, filed on May 28, 2021, entitled "THREE-DIMENSIONAL MEMORY DEVICE AND METHOD FOR FORMING THE SAME," which is hereby incorporated by reference in its entirety. This application is also related to U.S. application Ser. No. 17/459,480, filed on Aug. 27, 2021, entitled "THREE-DIMENSIONAL MEMORY DEVICE AND METHOD FOR FORMING THE SAME," which is hereby incorporated by reference in its entirety.

BACKGROUND

The present disclosure relates to memory devices and methods for forming memory devices, and more particularly, to three-dimensional (3D) memory devices and methods for forming 3D memory devices.

Planar semiconductor devices, such as memory cells, are scaled to smaller sizes by improving process technology, circuit design, programming algorithm, and fabrication process. However, as feature sizes of the semiconductor devices approach a lower limit, planar process and fabrication techniques become challenging and costly. A 3D semiconductor device architecture can address the density limitation in some planar semiconductor devices, for example, Flash memory devices.

A 3D semiconductor device can be formed by stacking semiconductor wafers or dies and interconnecting them vertically so that the resulting structure acts as a single device to achieve performance improvements at reduced power and a smaller footprint than conventional planar processes. Among the various techniques for stacking semiconductor substrates, bonding, such as hybrid bonding, is recognized as one of the promising techniques because of its capability of forming high-density interconnects.

SUMMARY

In one aspect, a 3D memory device is disclosed. The 3D memory device includes a doped semiconductor layer, a stack structure, and a channel structure. The stack structure includes interleaved conductive layers and dielectric layers formed on the doped semiconductor layer. The conductive layers include a plurality of word lines, and a drain select gate line. The channel structure extends through the stack structure along a first direction and is in contact with the doped semiconductor layer. The drain select gate line includes a first dielectric layer in contact with the channel structure, and a first polysilicon layer in contact with the first dielectric layer.

In another aspect, a 3D memory device is disclosed. The 3D memory device includes a doped semiconductor layer, a stack structure, and a channel structure. The stack structure includes interleaved conductive layers and dielectric layers formed on the doped semiconductor layer. The conductive layers include a source select gate line, and a plurality of word lines. The channel structure extends through the stack structure along a first direction and is in contact with the doped semiconductor layer. The source select gate line includes a first dielectric layer in contact with the channel structure, and a first polysilicon layer in contact with the first dielectric layer.

In still another aspect, a system is disclosed. The system includes a 3D memory device configured to store data and a memory controller. The 3D memory device includes a doped semiconductor layer, a stack structure, and a channel structure. The stack structure includes interleaved conductive layers and dielectric layers formed on the doped semiconductor layer. The conductive layers include a source select gate line, a plurality of word lines, and a drain select gate line. The channel structure extends through the stack structure along a first direction and is in contact with the doped semiconductor layer. The drain select gate line includes a first dielectric layer in contact with the channel structure, and a first polysilicon layer in contact with the first dielectric layer. The memory controller is coupled to the 3D memory device and is configured to control operations of the channel structure through the drain select gate line.

In yet another aspect, a system is disclosed. The system includes a 3D memory device configured to store data and a memory controller. The 3D memory device includes a doped semiconductor layer, a stack structure, and a channel structure. The stack structure includes interleaved conductive layers and dielectric layers formed on the doped semiconductor layer. The conductive layers include a source select gate line, a plurality of word lines, and a drain select gate line. The channel structure extends through the stack structure along a first direction and is in contact with the doped semiconductor layer. The source select gate line includes a first dielectric layer in contact with the channel structure, and a first polysilicon layer in contact with the first dielectric layer. The memory controller is coupled to the 3D memory device and is configured to control operations of the channel structure through the source select gate line.

In yet another aspect, a method for forming a 3D memory device is disclosed. A dielectric stack including a plurality of dielectric/sacrificial layer pairs is formed on a doped semiconductor layer. A channel structure is formed extending vertically through the dielectric stack. A first slit extending vertically in the dielectric stack is formed to remove a portion of a topmost sacrificial layer. The topmost sacrificial layer in the plurality of dielectric/sacrificial layer pairs is removed to form a first cavity in the dielectric stack. A portion of sidewalls of the channel structure exposed to the first cavity is removed. A drain select gate line is formed in the first cavity in the dielectric stack. A second slit extending vertically in the dielectric stack is formed to expose the doped semiconductor layer. A plurality of sacrificial layers in the plurality of dielectric/sacrificial layer pairs are removed to form a plurality of second cavities in the dielectric stack. A plurality of word lines are formed in the second cavities in the dielectric stack.

In yet another aspect, a method for forming a 3D memory device is disclosed. A dielectric stack including a plurality of dielectric/sacrificial layer pairs is formed on a doped semiconductor layer. A channel structure extending vertically through the dielectric stack is formed. A slit extending vertically in the dielectric stack is formed to expose the doped semiconductor layer. A bottommost sacrificial layer in the plurality of dielectric/sacrificial layer pairs is removed to form a first cavity in the dielectric stack. A source select gate line is formed in the first cavity in the dielectric stack. A plurality of sacrificial layers in the plurality of dielectric/sacrificial layer pairs are removed to form a plurality of second cavities in the dielectric stack. A plurality of word lines are formed in the second cavities in the dielectric stack.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

Figure 1:
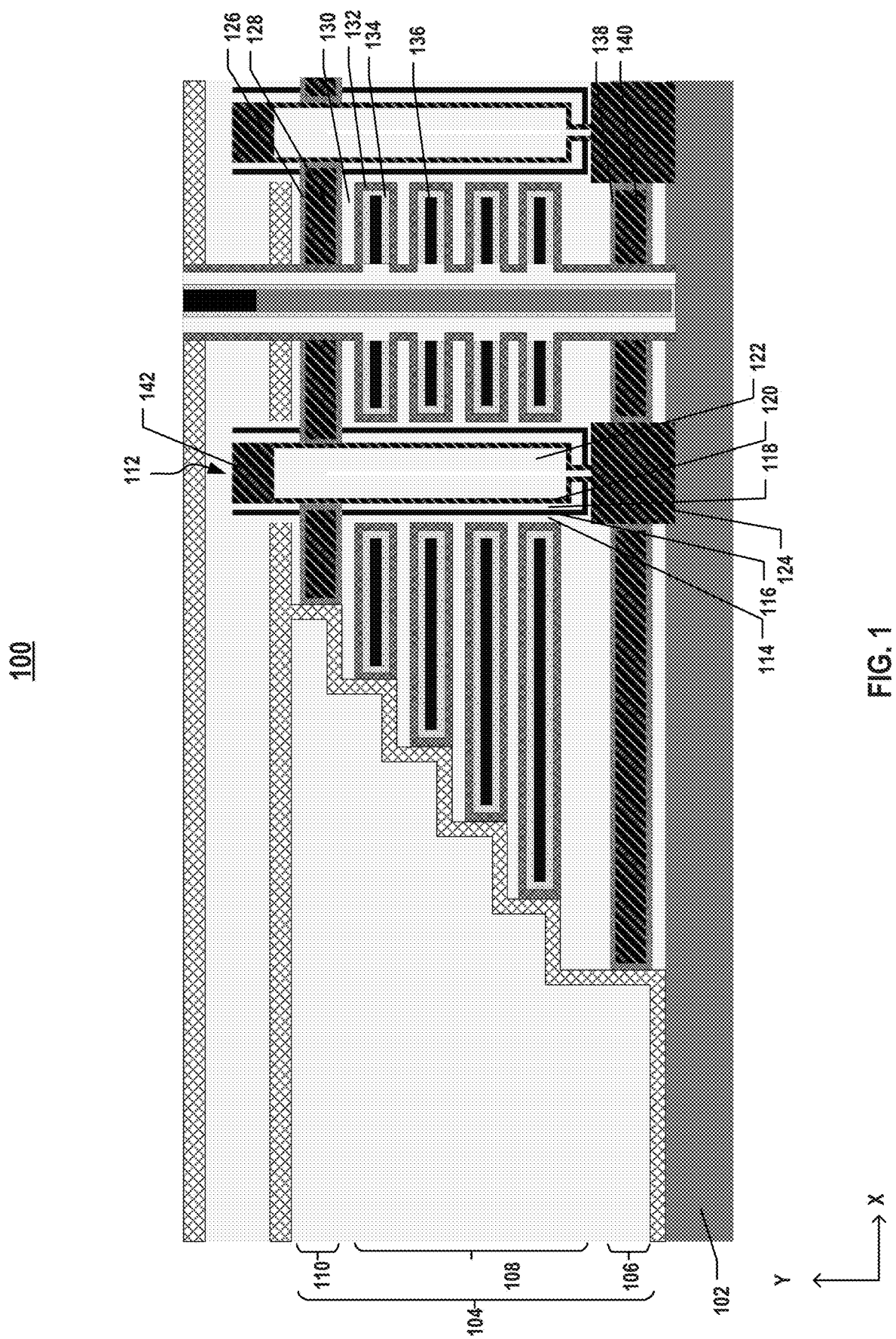
FIG. 1 illustrates a cross-section of an exemplary 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, such as 3D NAND memory devices, a stack of gate electrodes may be arranged over a substrate, with a plurality of semiconductor channels through and intersecting word lines, into the implanted substrate. The bottom/lower gate electrode or electrodes function as source select gate lines, which are also called bottom select gates (BSG) in some cases. The top/upper gate electrode or electrodes function as drain select gate lines, which are also called top select gates (TSG) in some cases. The gate electrodes between the top/upper select gate electrodes and the bottom/lower gate electrodes function as word lines (WLs). The intersection of a word line and a semiconductor channel forms a memory cell.

FIG. 1 illustrates a cross-section of an exemplary 3D memory device 100, according to some aspects of the present disclosure. 3D memory device 100 may include a substrate 102, which is a doped semiconductor layer and may include silicon (e.g., single crystalline silicon), silicon germanium (SiGe), gallium arsenide (GaAs), germanium (Ge), silicon on insulator (SOI), germanium on insulator (GOI), or any other suitable materials. In some implementations, substrate 102 is a thinned substrate (e.g., a semiconductor layer), which was thinned by grinding, etching, chemical mechanical polishing (CMP), or any combination thereof. It is noted that x and y axes are included in FIG. 1 to further illustrate the spatial relationship of the components in 3D memory device 100. Substrate 102 of 3D memory device 100 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a 3D memory device (e.g., 3D memory device 100) is determined relative to the substrate of the 3D memory device (e.g., substrate 102) in they-direction (i.e., the vertical direction) when the substrate is positioned in the lowest plane of the 3D memory device in they-direction. The same notion for describing spatial relationships is applied throughout the present disclosure.

3D memory device 100 may be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or to be formed on the same substrate.

Alternatively, 3D memory device 100 may be part of a non-monolithic 3D memory device, in which components (e.g., the peripheral device and memory array device) may be formed separately on different substrates and then bonded, for example, in a face-to-face manner. In some implementations, the memory array device substrate (e.g., substrate 102) remains as the substrate of the bonded non-monolithic 3D memory device, and the peripheral device (e.g., including any suitable digital, analog, and/or mixed-signal peripheral circuits used for facilitating the operation of 3D memory device 100, such as page buffers, decoders, and latches; not shown) is flipped and faces down toward the memory array device (e.g., NAND memory strings) for hybrid bonding. It is understood that in some implementations, the memory array device substrate (e.g., substrate 102) is flipped and faces down toward the peripheral device (not shown) for hybrid bonding, so that in the bonded non-monolithic 3D memory device, the memory array device is above the peripheral device. The memory array device substrate (e.g., substrate 102) may be a thinned substrate (which is not the substrate of the bonded non-monolithic 3D memory device), and the back-end-of-line (BEOL) interconnects of the non-monolithic 3D memory device may be formed on the backside of the thinned memory array device substrate.

In some implementations, 3D memory device 100 is a NAND Flash memory device in which memory cells are provided in the form of an array of NAND memory strings each extending vertically above substrate 102. As shown in FIG. 1, 3D memory device 100 may include a stack structure 104 formed on substrate 102, and NAND memory string may include a channel structure 112 extending vertically through stack structure 104 in the y-direction. Stack structure 104 includes interleaved conductive layers and dielectric layers 130, and the conductive layers may include at least one source select gate line 106, a plurality of word lines 108, and at least one drain select gate line 110.

Channel structure 112 may include a channel hole filled with semiconductor materials (e.g., as a semiconductor channel 120) and dielectric materials (e.g., as a memory film). In some implementations, semiconductor channel 120 includes silicon, such as amorphous silicon, polysilicon, or single crystalline silicon. In some implementations, the memory film is a composite layer including a tunneling layer 118, a storage layer 116 (also known as a "charge trap layer"), and a blocking layer 114. In some implementations, the remaining space of channel structure 112 may be partially or fully filled with a filling layer 122 including dielectric materials, such as silicon oxide. Channel structure 112 may have a cylinder shape (e.g., a pillar shape). Filling layer 122, semiconductor channel 120, tunneling layer 118, storage layer 116, and blocking layer 114 are arranged radially from the center toward the outer surface of the pillar in this order, according to some implementations. Tunneling layer 118 may include silicon oxide, silicon oxynitride, or any combination thereof. Storage layer 116 may include silicon nitride, silicon oxynitride, silicon, or any combination thereof. Blocking layer 114 may include silicon oxide, silicon oxynitride, high dielectric constant (high-k) dielectrics, or any combination thereof. In one example, the memory film may include a composite layer of silicon oxide/silicon oxynitride (or silicon nitride)/silicon oxide (ONO).

In some implementations, NAND memory string may further include a channel contact 124, or called semiconductor plug, in a lower portion (e.g., at the lower end) of NAND memory string below channel structure 112. As used herein, the "upper end" of a component (e.g., NAND memory string) is the end farther away from substrate 102 in they-direction, and the "lower end" of the component (e.g., NAND memory string) is the end closer to substrate 102 in the y-direction when substrate 102 is positioned in the lowest plane of 3D memory device 100. Channel contact 124 may include a semiconductor material, such as silicon, which is epitaxially grown from substrate 102 in any suitable directions. It is understood that in some implementations, channel contact 124 includes single crystalline silicon, the same material as substrate 102. In other words, channel contact 124 may include an epitaxially-grown semiconductor layer that is the same as the material of substrate 102. In some implementations, part of channel contact 124 is above the top surface of substrate 102 and in contact with semiconductor channel 120. Channel contact 124 may function as a channel controlled by a source select gate of NAND memory string. It is understood that in some implementations, 3D memory device 100 does not include channel contact 124.

In some implementations, NAND memory string further includes a channel plug 142 in an upper portion (e.g., at the upper end) of NAND memory string. Channel plug 142 may be in contact with the upper end of semiconductor channel 120. Channel plug 142 may include semiconductor materials (e.g., polysilicon). By covering the upper end of channel structure 112 during the fabrication of 3D memory device 100, channel plug 142 may function as an etch stop layer to prevent etching of dielectrics filled in channel structure 112, such as silicon oxide and silicon nitride. In some implementations, channel plug 142 also functions as the drain of NAND memory string. It is understood that in some implementations, 3D memory device 100 does not include channel plug 142.

The memory array device may include NAND memory strings that extend through stack structure 104. Stack structure 104 includes interleaved conductive layers and dielectric layers 130, and the stacked conductive/dielectric layer pairs are also referred to as a memory stack. In some implementations, a pad oxide layer (not shown) is formed between substrate 102 and stack structure 104. The number of the conductive/dielectric layer pairs in stack structure 104 determines the number of memory cells in 3D memory device 100. The conductive layers may include at least one source select gate line 106, a plurality of word lines 108, and at least one drain select gate line 110. Source select gate line 106 may be the one or more than one bottom/lower conductive layers and may function as source select gate lines, which are also called bottom select gates (BSG) in some cases. Drain select gate line 110 may be the one or more than one top/upper conductive layers and may function as drain select gate lines, which are also called top select gates (TSG) in some cases. The conductive layers between source select gate line 106 and drain select gate line 110 may be word lines 108.

Word lines 108 may include conductive materials including, but not limited to, tungsten (W), cobalt (Co), copper (Cu), aluminum (Al), polysilicon, doped silicon, silicides, or any combination thereof. Dielectric layers 130 may include dielectric materials including, but not limited to, silicon oxide, silicon nitride, silicon oxynitride, or any combination thereof.

In some implementations, each word line 108 in memory stack 104 functions as a gate conductor of memory cells in NAND memory string. Word lines 108 may extend laterally coupling a plurality of memory cells. In some implementations, memory cell transistors in NAND memory string include semiconductor channel 120, memory film (including tunneling layer 118, storage layer 116, and blocking layer 114), a gate conductor 136 made from tungsten, adhesion layers 134 including titanium/titanium nitride (Ti/TiN) or tantalum/tantalum nitride (Ta/TaN), gate dielectric layers 132 made from high-k dielectric materials, and channel structure 112. As shown in FIG. 1, gate dielectric layers 132 contact blocking layer 114 of channel structure 112.

Drain select gate line 110 may include a dielectric layer 126 and a polysilicon layer 128. As shown in FIG. 1, dielectric layer 126 directly contacts channel structure 112. Specifically, dielectric layer 126 directly contacts semiconductor channel 120 of channel structure 112. Polysilicon layer 128 locates inside and in contact with dielectric layer 126. In other words, the material of drain select gate line 110 is polysilicon, which is different from the material of word lines 108. Source select gate line 106 may include a dielectric layer 138 and a polysilicon layer 140. As shown in FIG. 1, dielectric layer 138 directly contacts channel structure 112. Specifically, dielectric layer 138 directly contacts channel contact 124. Polysilicon layer 140 locates inside and in contact with dielectric layer 138. In other words, the material of source select gate line 106 is polysilicon, which is different from the material of word lines 108.

In the situation that drain select gate line 110 or source select gate line 106 are formed by the same material, e.g., W, with word lines 108, the threshold voltage (Vt) of the TSG transistor or the BSG transistor may have a shift in some working modes or under some voltage arrangements. For example, if a high voltage applied to the NAND memory string or the memory device is operated at a high temperature during the program/erase cycling, the threshold voltage (Vt) of the TSG transistor or the BSG transistor may have a shift. By using the polysilicon material to form drain select gate line 110 or source select gate line 106, the induced threshold voltage (Vt) shift of TSG transistor or the BSG transistor can be prevented. In some implementations, drain select gate line 110 and source select gate line 106 may be both formed by polysilicon material. In some implementations, one of drain select gate line 110 and source select gate line 106 may be formed by polysilicon material.

FIGS. 2-20 illustrate cross-sections of 3D memory device 100 at different stages of a manufacturing process, according to some aspects of the present disclosure. FIG. 21 illustrates a flowchart of an exemplary method 200 for forming 3D memory device 100, according to some aspects of the present disclosure. For the purpose of better describing the present disclosure, the cross-sections of 3D memory device 100 in FIGS. 2-20 and method 200 in FIG. 21 will be discussed together. It is understood that the operations shown in method 200 are not exhaustive and that other operations may be performed as well before, after, or between any of the illustrated operations. Further, some of the operations may be performed simultaneously, or in a different order than shown in FIGS. 2-20 and FIG. 21.

Figure 2:
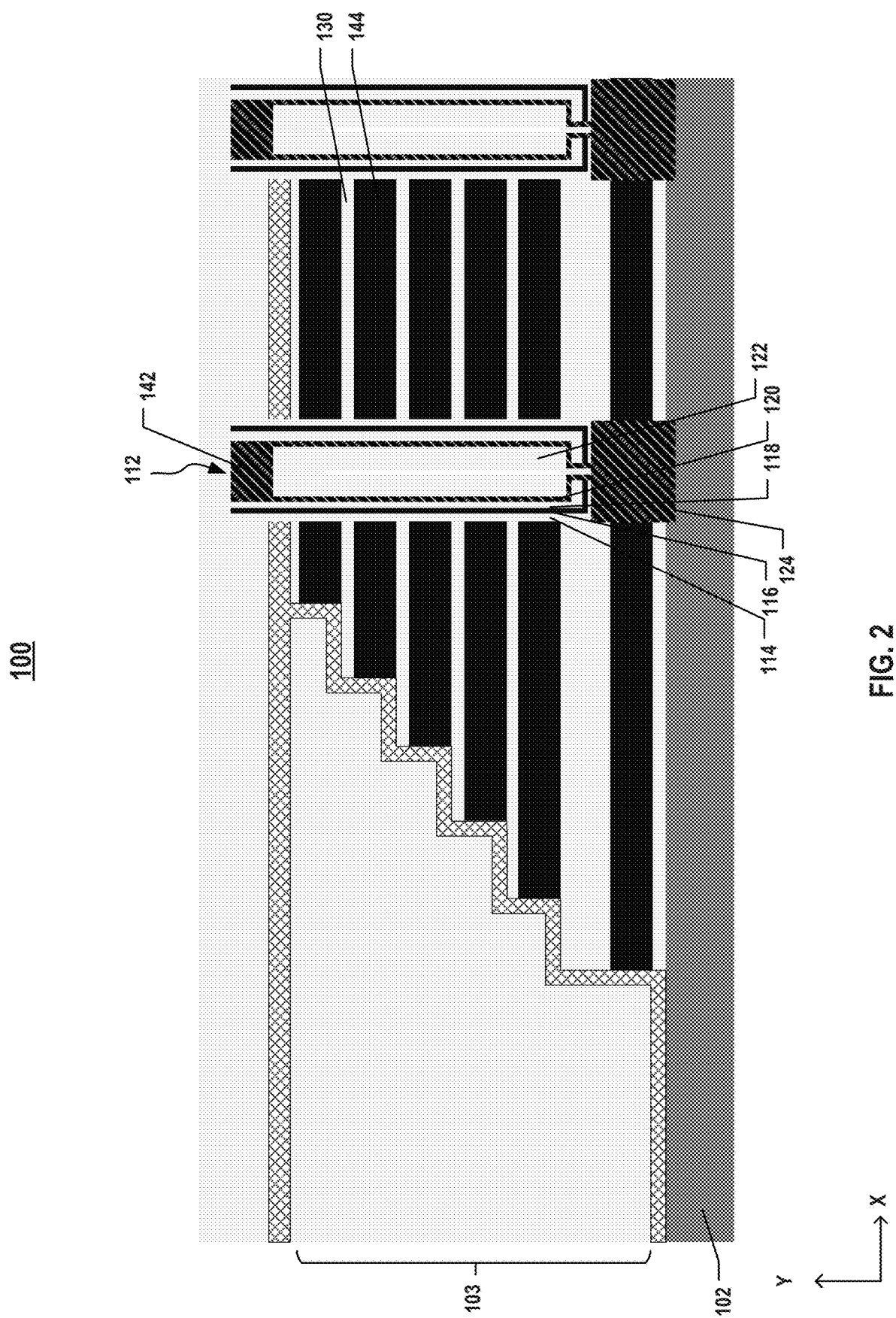
FIGS. 2-20 illustrate cross-sections of an exemplary 3D memory device at different stages of a manufacturing process, according to some aspects of the present disclosure.

As shown in FIG. 2 and operation 202 of FIG. 21, a dielectric stack 103 including a plurality of dielectric/sacrificial layer pairs is formed on substrate 102. In some implementations, substrate 102 may be a doped semiconductor layer. The dielectric/sacrificial layer pairs include interleaved dielectric layers 130 and sacrificial layers 144 extending in the x-direction. In some implementations, each dielectric layer 130 may include a layer of silicon oxide, and each sacrificial layer 144 may include a layer of silicon nitride. Dielectric stack 103 may be formed by one or more thin film deposition processes including, but not limited to, chemical vapor deposition (CVD), physical vapor deposition (PVD), atomic layer deposition (ALD), or any combination thereof. In some implementations, a pad oxide layer (not shown) is formed between substrate 102 and dielectric stack 103 by depositing dielectric materials, such as silicon oxide, on substrate 102.

Channel structure 112 is formed extending vertically through dielectric stack 103 in the y-direction, as shown in operation 204 of FIG. 21. In some implementations, an etch process may be performed to form a channel hole in dielectric stack 103 that extends vertically through the interleaved dielectric/sacrificial layers. In some implementations, fabrication processes for forming the channel hole may include wet etching and/or dry etching, such as deep reactive ion etching (DRIE). In some implementations, the channel hole may extend further into the top portion of substrate 102. The etch process through dielectric stack 103 may not stop at the top surface of substrate 102 and may continue to etch part of substrate 102. After the formation of the channel hole, an epitaxial operation, e.g., a selective epitaxial growth operation, may be performed to form channel contact 124 on the bottom of the channel hole. Channel contact 124, or called semiconductor plug, can include a semiconductor material, such as silicon, which is epitaxially grown from substrate 102 in any suitable direction. Then, the memory film, including tunneling layer 118, storage layer 116, and blocking layer 114, and semiconductor channel 120 can be formed on channel contact 124.

Figure 3:
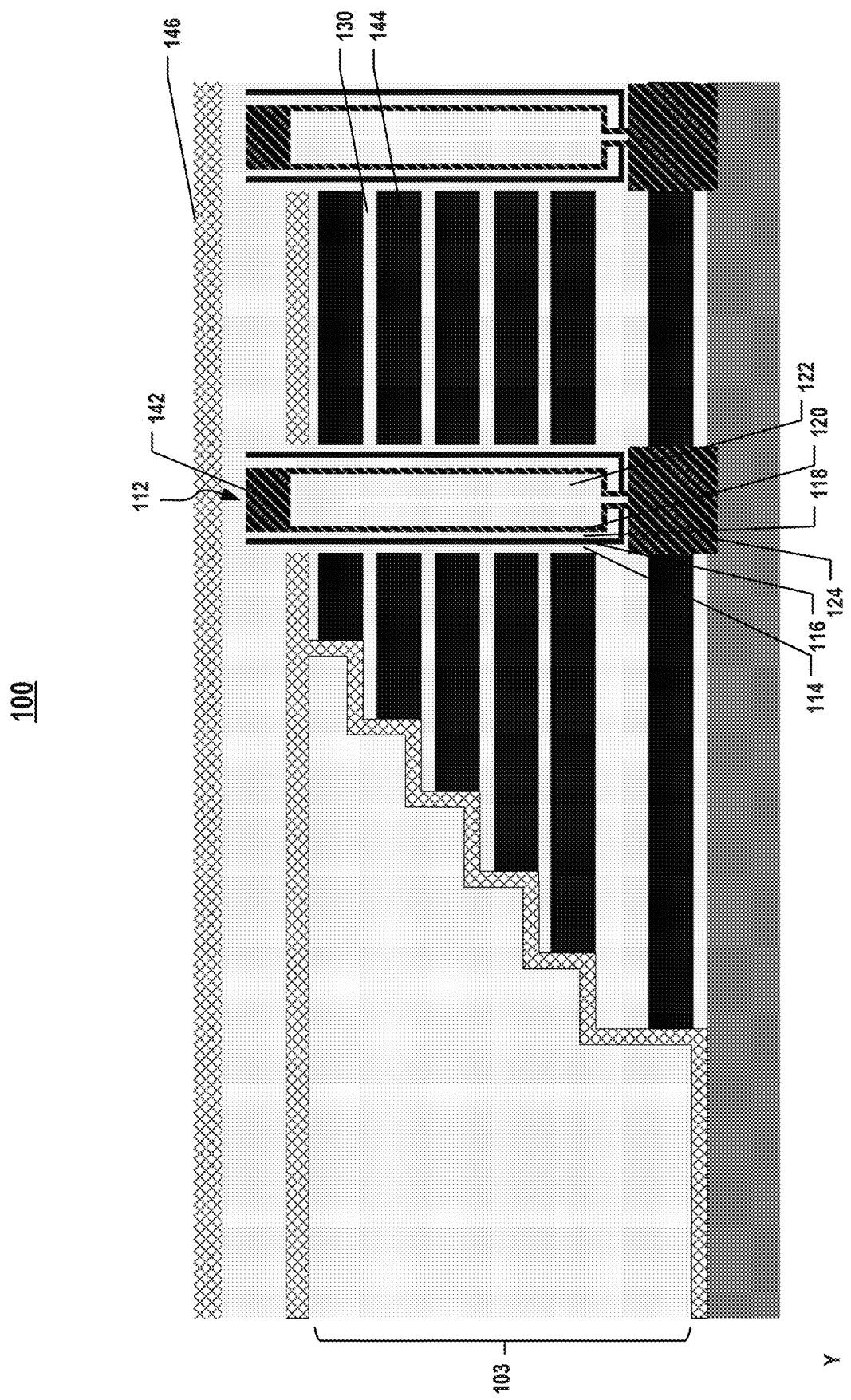
Figure 4:
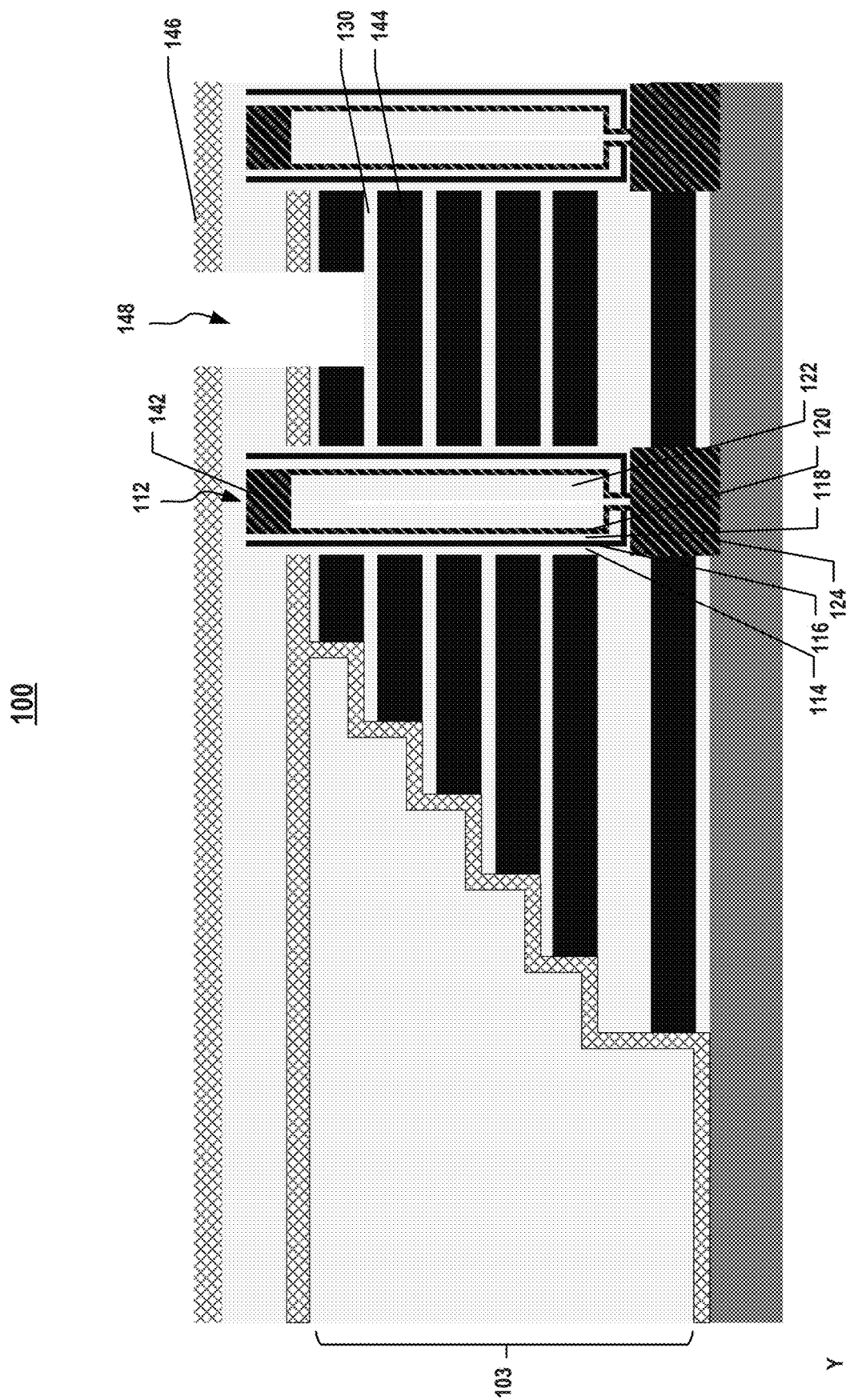

As shown in operation 206 of FIG. 21, a first slit 148 extending vertically in dielectric stack 103 is formed to remove a portion of a topmost layer of sacrificial layers 144. As shown in FIG. 3, a hard mask 146 is formed on dielectric stack 103, and then, as shown in FIG. 4, a lithography process and an etch process may be performed in hard mask 146 and dielectric stack 103 to form first slit 148. First slit 148 may be formed to expose the topmost one layer or the topmost multiple layers of sacrificial layers 144 depending on the design of the TSG of 3D memory device 100. In some implementations, the etch process for removing the portion of dielectric stack 103 may include a plurality of etch processes alternatively removing the silicon oxide layers and the silicon nitride layers.

Figure 5:
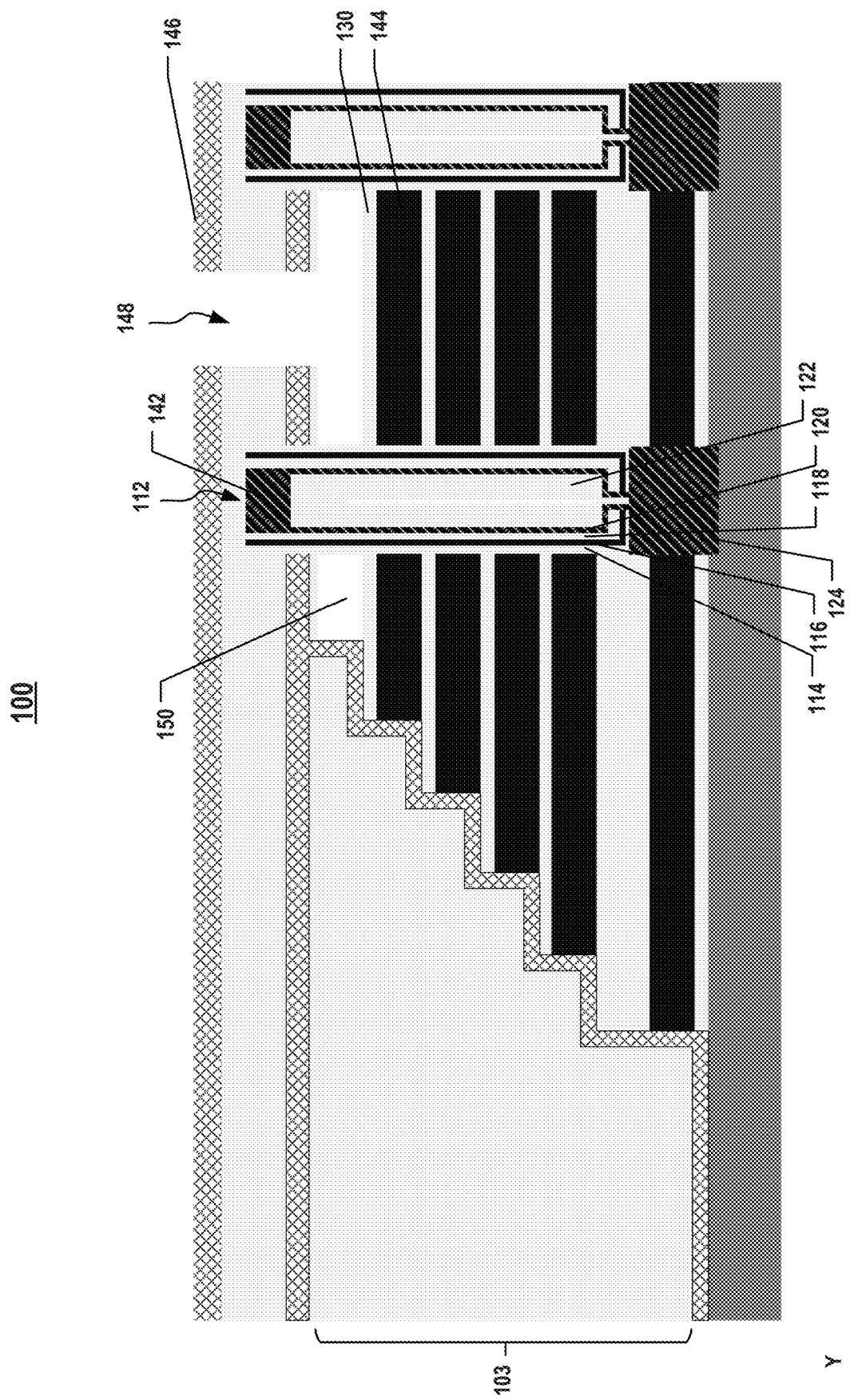
Figure 6:
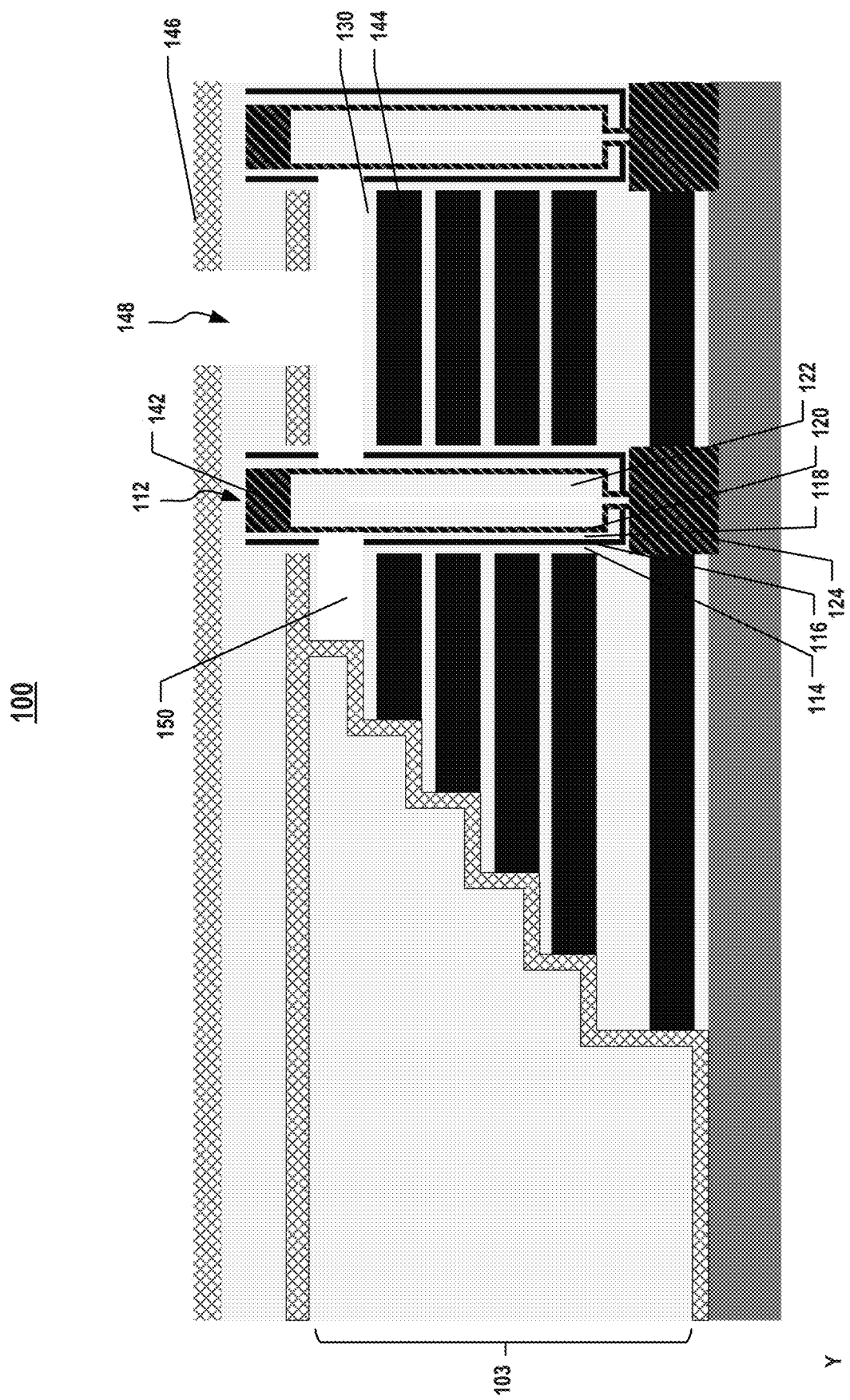

As shown in FIG. 5 and operation 208 of FIG. 21, the topmost layer of sacrificial layers 144 is removed to form a cavity 150 in dielectric stack 103. In some implementations, the topmost layer of sacrificial layers 144 is a silicon nitride layer and may be removed by wet etch, dry etch, or other suitable processes. Then, as shown in FIG. 6 and operation 210 of FIG. 21, a portion of sidewalls of channel structure 112 is removed. Specifically, the memory film portion, including tunneling layer 118, storage layer 116, and blocking layer 114, on sidewalls of channel structure 112 exposed to cavity 150 is removed until exposing semiconductor channel 120. In some implementations, tunneling layer 118, storage layer 116, and blocking layer 114, on sidewalls of channel structure 112 exposed to cavity 150 may be removed by wet etch, dry etch, or other suitable processes. After operation 210, hard mask 146 is removed.

Figure 7:
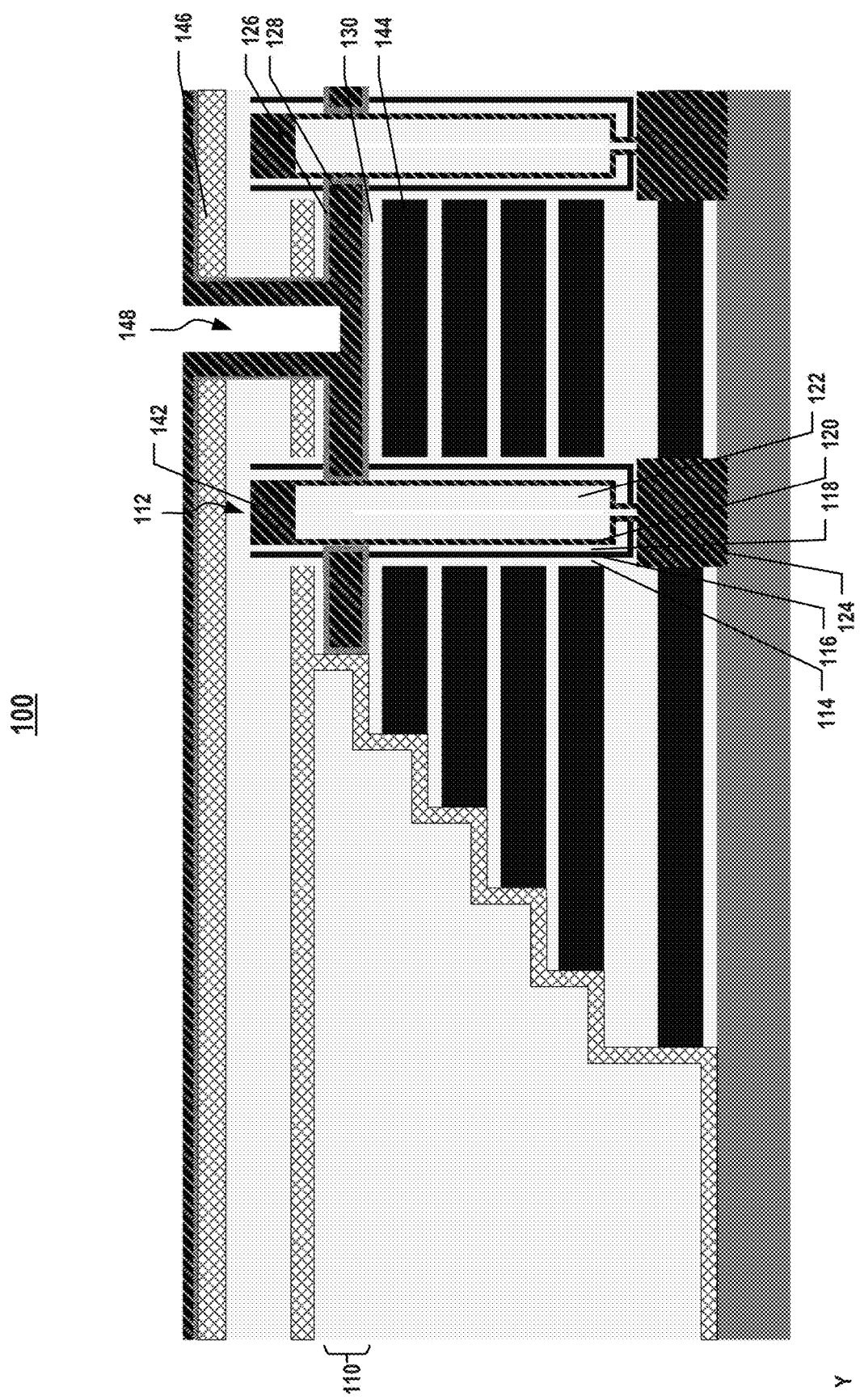

As shown in FIG. 7 and operation 212 of FIG. 21, drain select gate line 110 is formed in cavity 150 in dielectric stack 103. In some implementations, the formation of drain select gate line 110 may include firstly forming dielectric layer 126 on the sidewalls of cavity 150 and first slit 148. Dielectric layer 126 directly contacts semiconductor channel 120. In some implementations, dielectric layer 126 may include silicon oxide and may be formed by ALD, PVD, CVD, or other suitable processes. In some implementations, dielectric layer 126 may include silicon nitride, high-k dielectric materials, or other suitable materials. Then, polysilicon layer 128 is formed on dielectric layer 126 in cavity 150 and first slit 148. For example, polysilicon layer 128 may be formed by atmospheric pressure CVD (APCVD) process to form in-situ n+ doped polysilicon.

Figure 8:
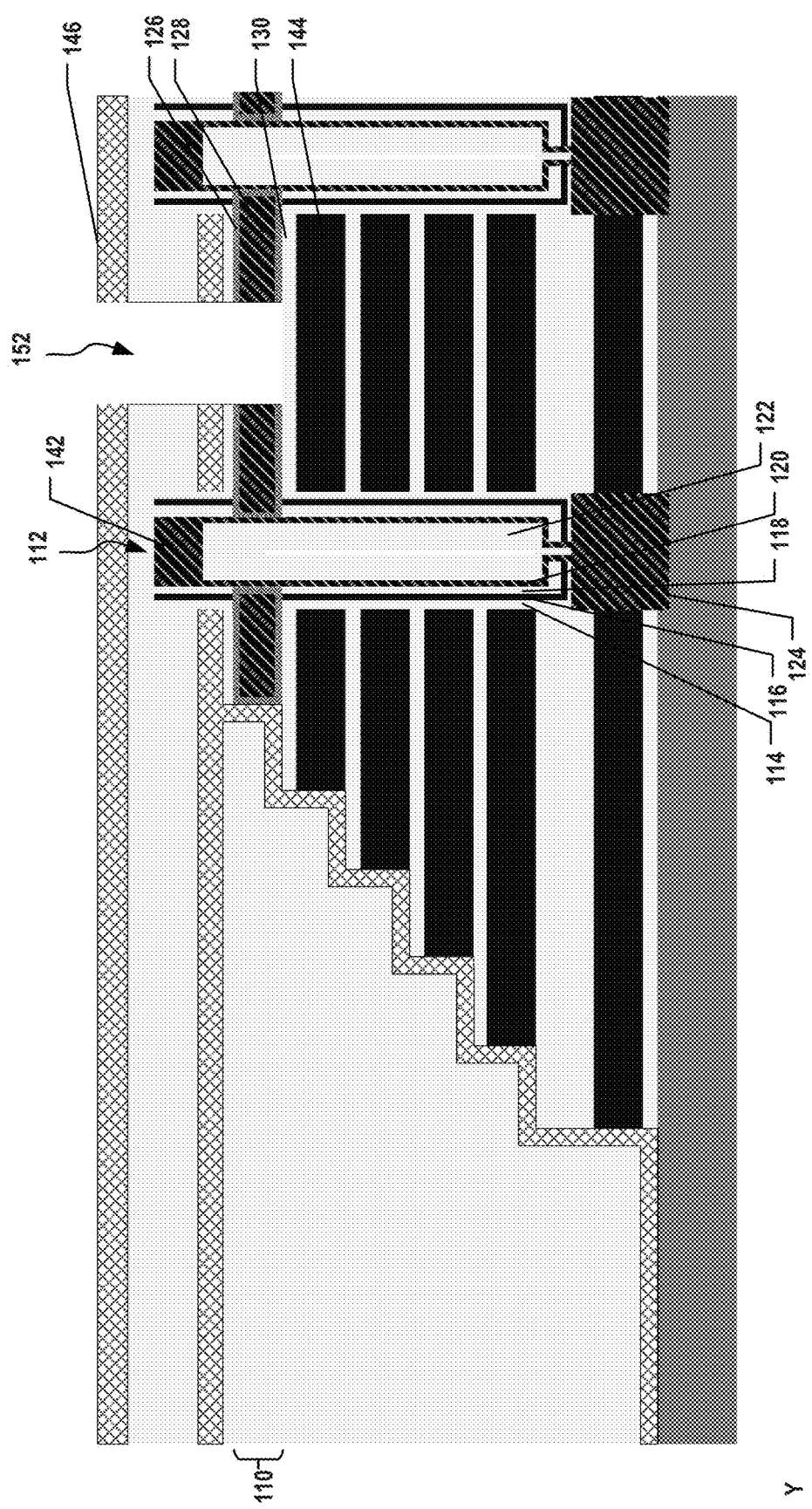
Figure 9:
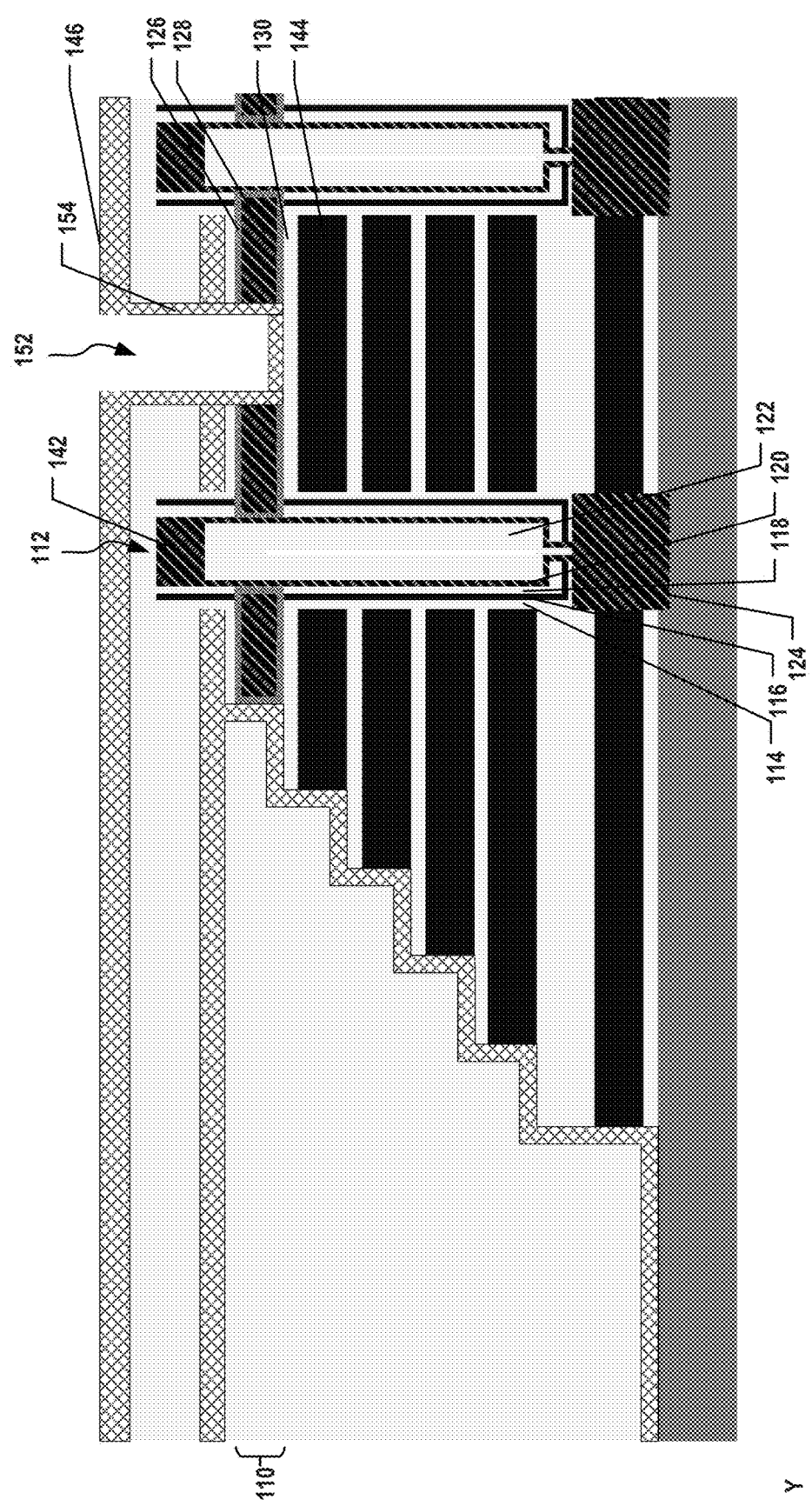
Figure 10:
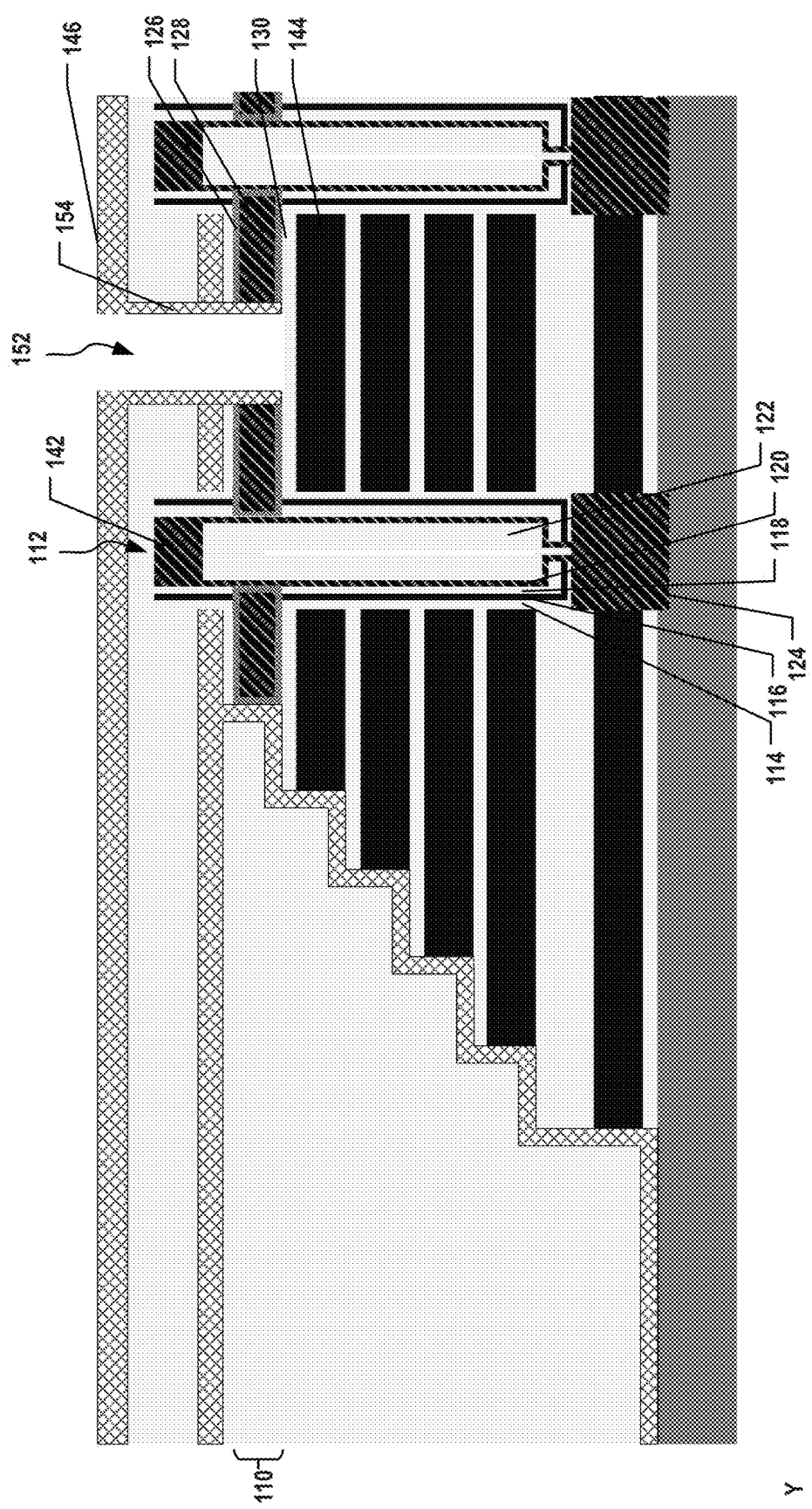

In operation 214 of FIG. 21, a second slit 152 extending vertically in dielectric stack 103 is formed to expose substrate 102. In some implementations, the formation of second slit 152 may include multiple etch and lithography operations, as shown in FIGS. 8-14. As shown in FIG. 8, dielectric layer 126 and polysilicon layer 128 on the sidewalls of first slit 148 and on dielectric stack 103 are removed first. After the removal of dielectric layer 126 and polysilicon layer 128, second slit 152 is formed. For the purpose of better describing the present disclosure, second slit 152 is used here to describe the opening after the removal of dielectric layer 126 and polysilicon layer 128, and second slit 152 may be extended in the subsequential operations. Then, as shown in FIG. 9, a spacer hard mask 154 is formed on the bottom and the sidewalls of second slit 152. As shown in FIG. 10, spacer hard mask 154 on the bottom of second slit 152 is then removed.

Figure 11:
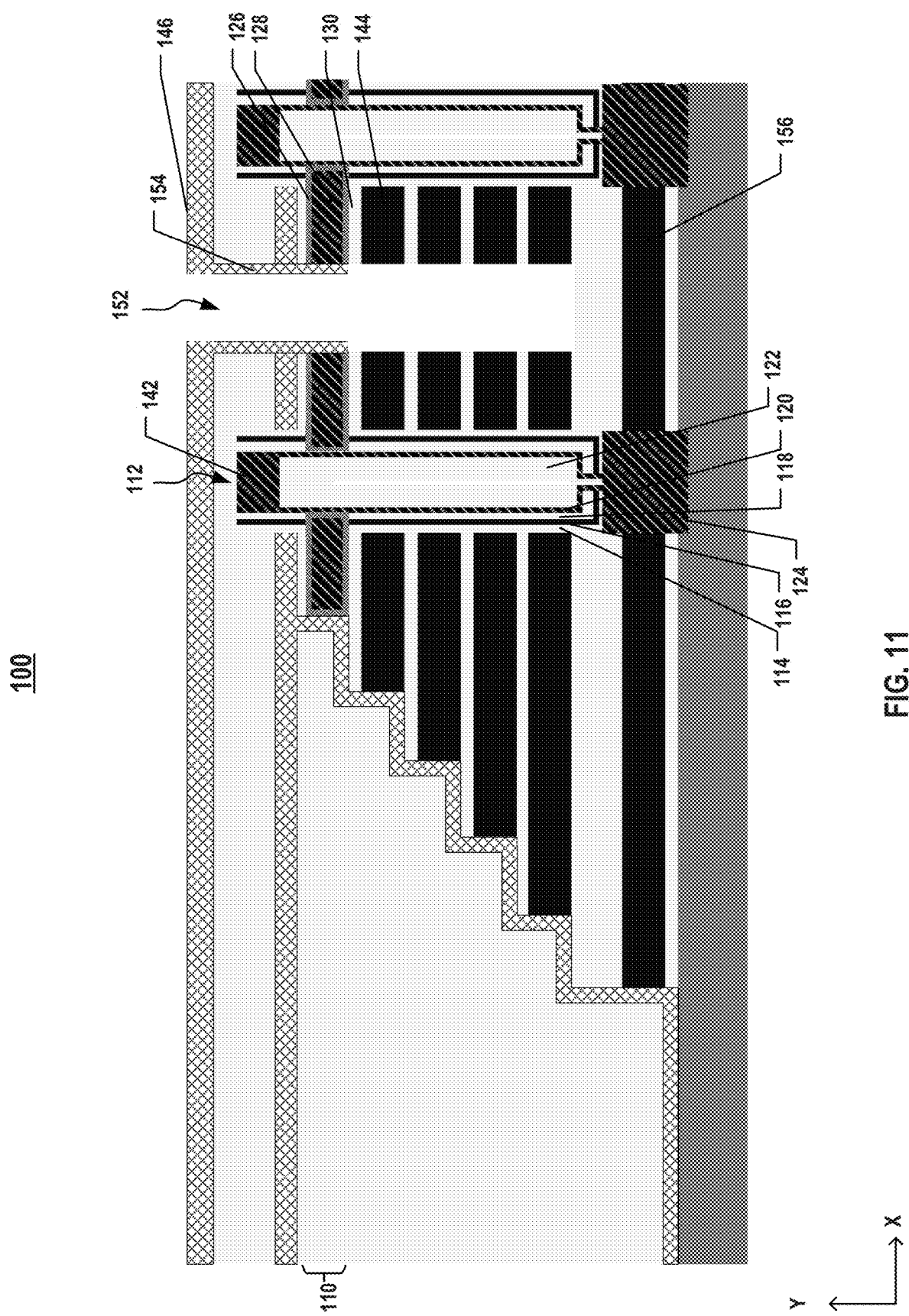
Figure 12:
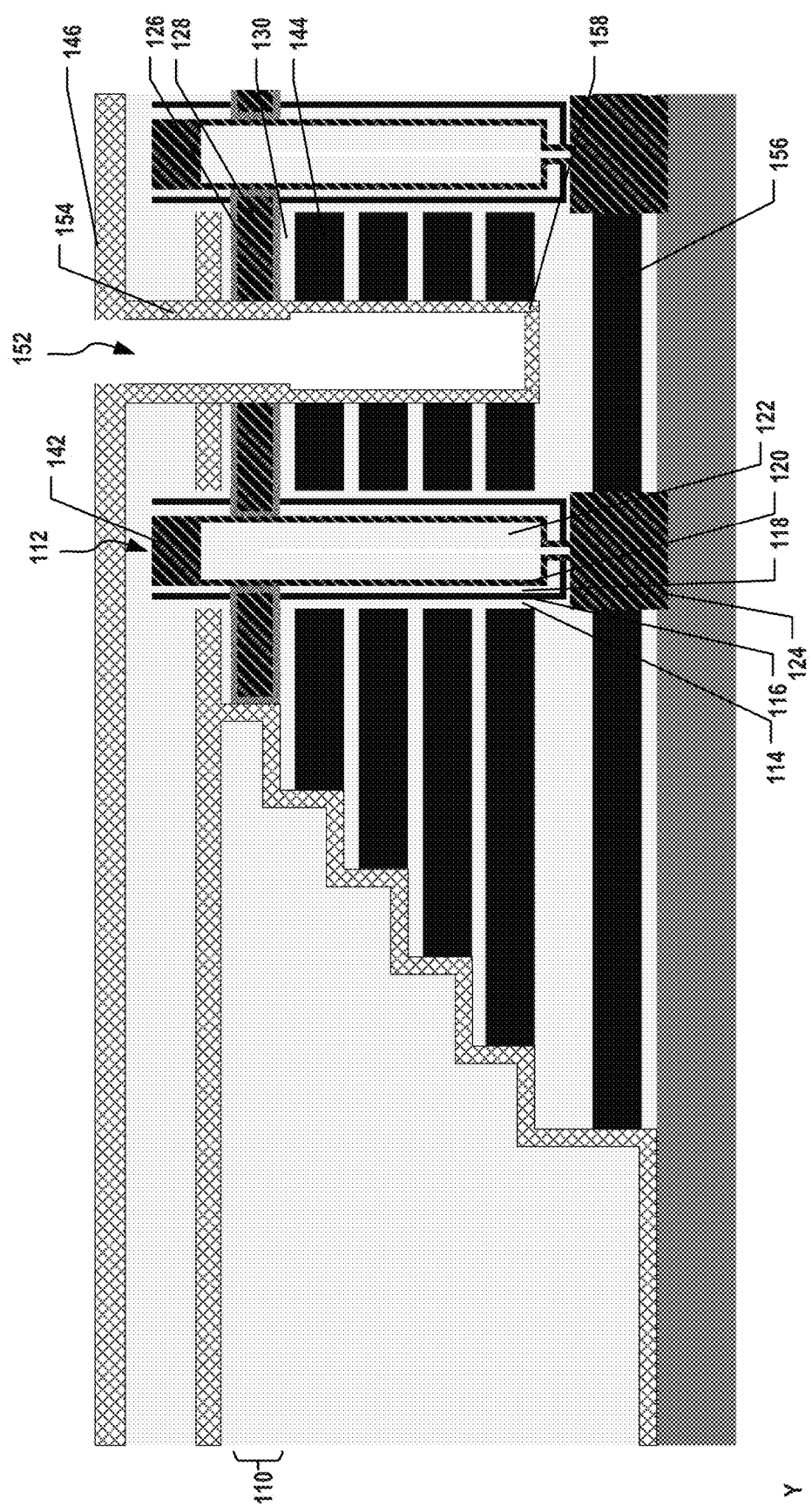
Figure 13:
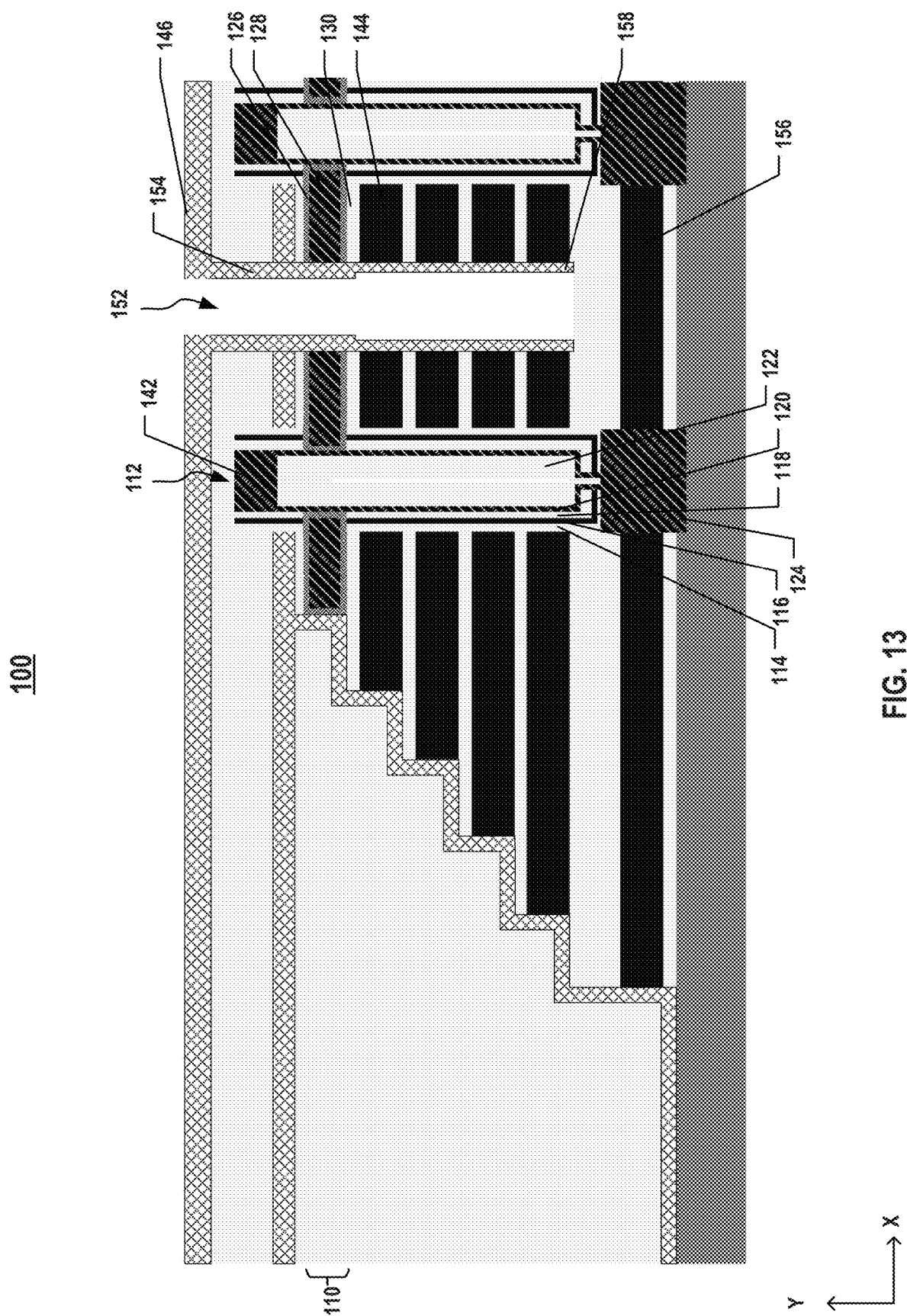

Another etch process is performed to remove a portion of the interleaved dielectric/sacrificial layers beneath drain select gate line 110 until the dielectric layer above the bottommost sacrificial layer 156, as shown in FIG. 11. Spacer hard mask 154 on the sidewalls of second slit 152 may protect drain select gate line 110 during the etch process, and second slit 152 is extended after the etch process. In some implementations, the etch process for removing the portion of the interleaved dielectric/sacrificial layers may include a plurality of etch processes alternatively removing the silicon oxide layers and the silicon nitride layers. The exposed sacrificial layers 144 are the layers that will be removed and replaced by the word lines in later operations. As shown in FIG. 12, another spacer hard mask 158 may be formed on the bottom and the sidewalls of second slit 152. The portion of spacer hard mask 158 on the bottom of second slit 152 is removed, as shown in FIG. 13.

Figure 14:
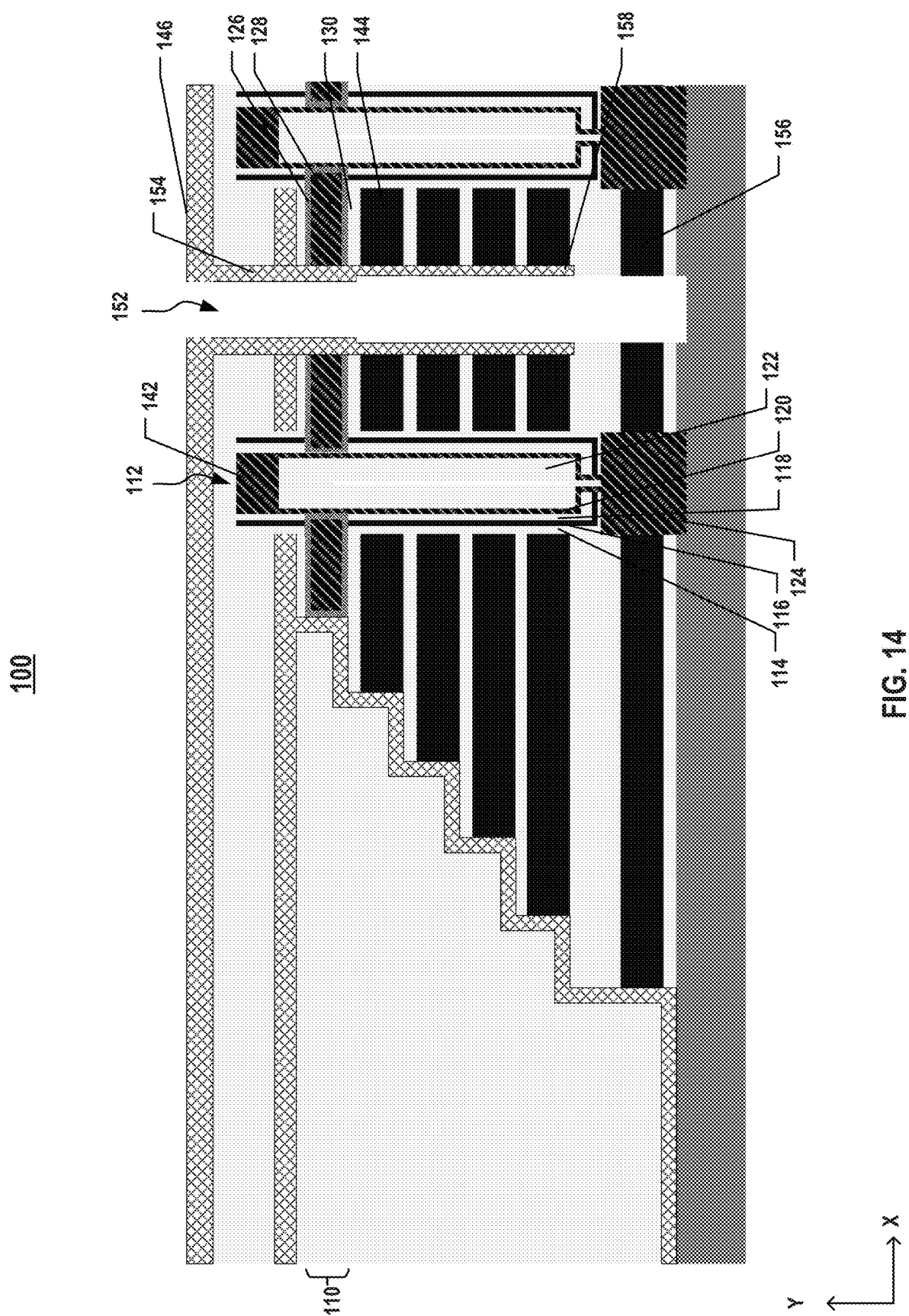

As shown in FIG. 14, a further etch process may be performed to remove a portion of sacrificial layer 156 and the dielectric layer above sacrificial layer 156 until exposing substrate 102. Spacer hard mask 154 and spacer hard mask 158 may protect drain select gate line 110 and the interleaved dielectric/sacrificial layers during the etch process. In some implementations, the etch process for removing the portion of sacrificial layer 156 and the dielectric layer above sacrificial layer 156 may include a plurality of etch processes alternatively removing the silicon oxide layers and the silicon nitride layers.

Figure 15:
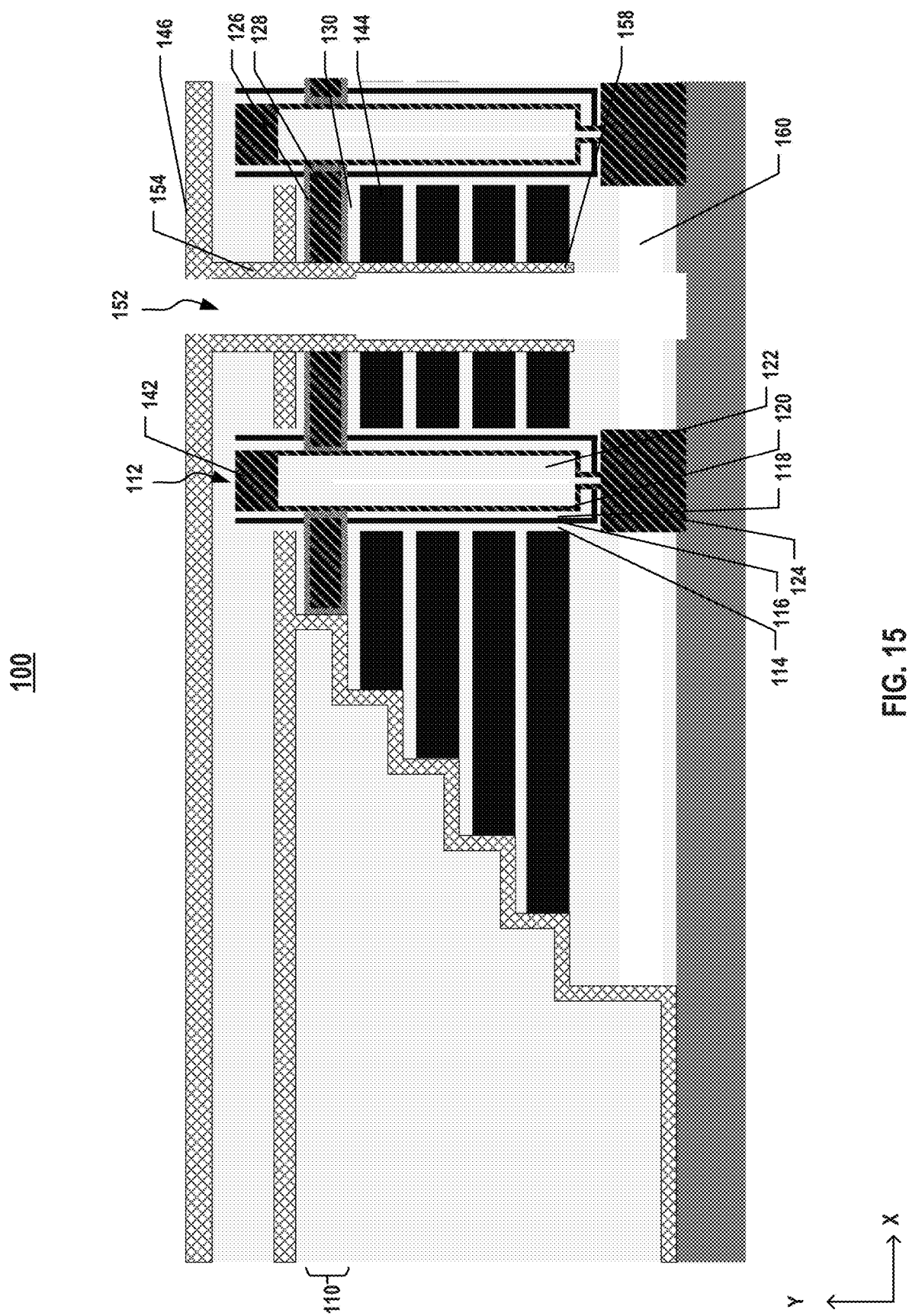
Figure 16:
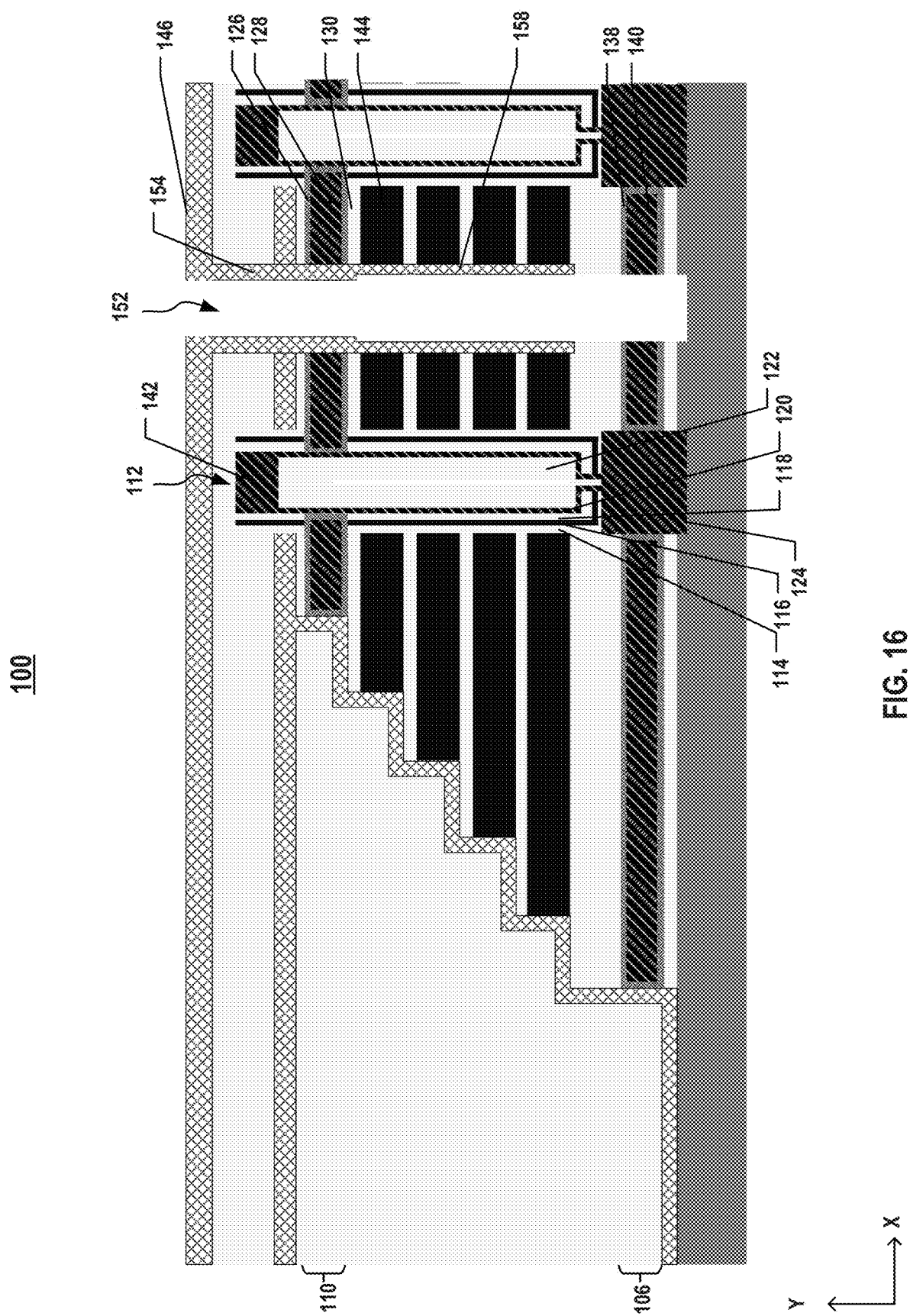
Figure 17:
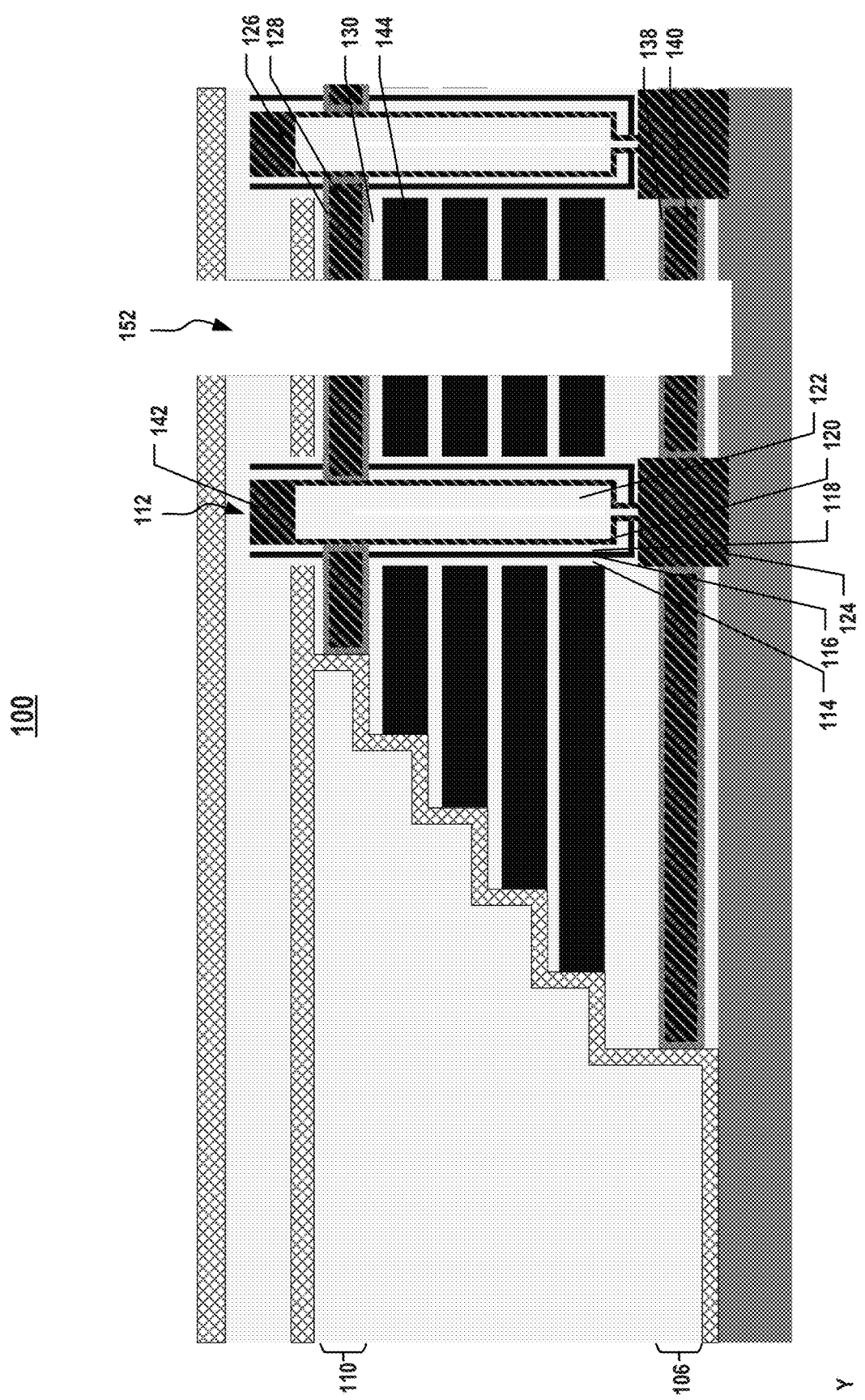

As shown in FIG. 15, sacrificial layer 156 is removed to form a cavity 160 in dielectric stack 103 to expose channel contact 124. In some implementations, sacrificial layer 156 is a silicon nitride layer and may be removed by wet etch, dry etch, or other suitable processes. Then, source select gate line 106 is formed in cavity 160 in dielectric stack 103, as shown in FIG. 16. In some implementations, the formation of source select gate line 106 may include firstly forming dielectric layer 138 on the sidewalls of cavity 160. Dielectric layer 138 directly contacts channel contact 124. In some implementations, dielectric layer 138 may include silicon oxide and may be formed by ALD, PVD, CVD, or other suitable processes. In some implementations, dielectric layer 138 may include silicon nitride, high-k dielectric materials, or other suitable materials. Then, polysilicon layer 140 is formed on dielectric layer 138 in cavity 160. For example, polysilicon layer 140 may be formed by APCVD process to form in-situ n+ doped polysilicon. Then, as shown in FIG. 17, spacer hard mask 154 and spacer hard mask 158 are removed.

Figure 18:
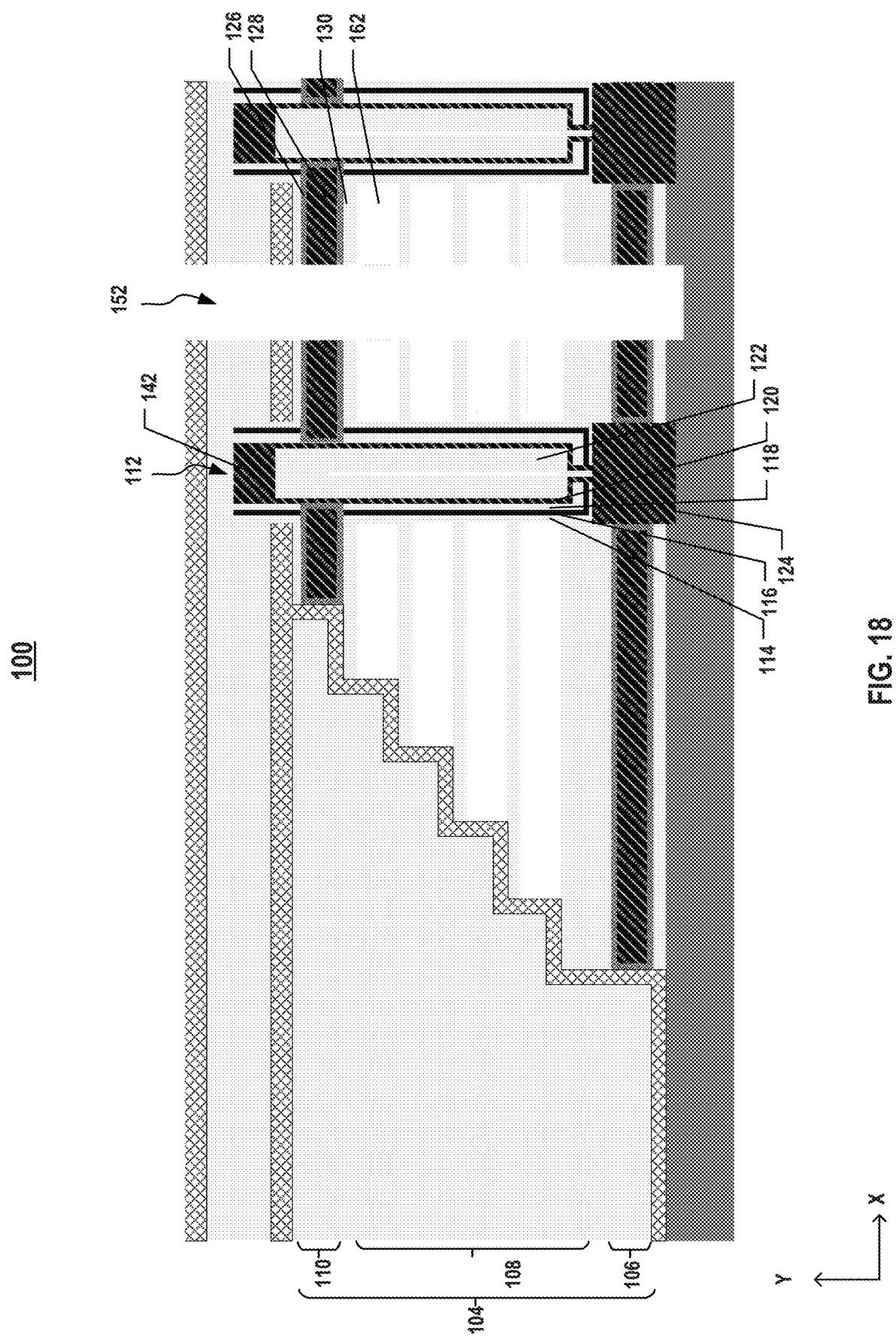

As shown in FIG. 18 and operation 216 of FIG. 21, sacrificial layers 144 in the dielectric/sacrificial layer pairs are removed to form a plurality of cavities 162 in dielectric stack 103. In some implementations, sacrificial layers 144 are silicon nitride layers and may be removed by wet etch, dry etch, or other suitable processes to form cavities 162.

Figure 19:
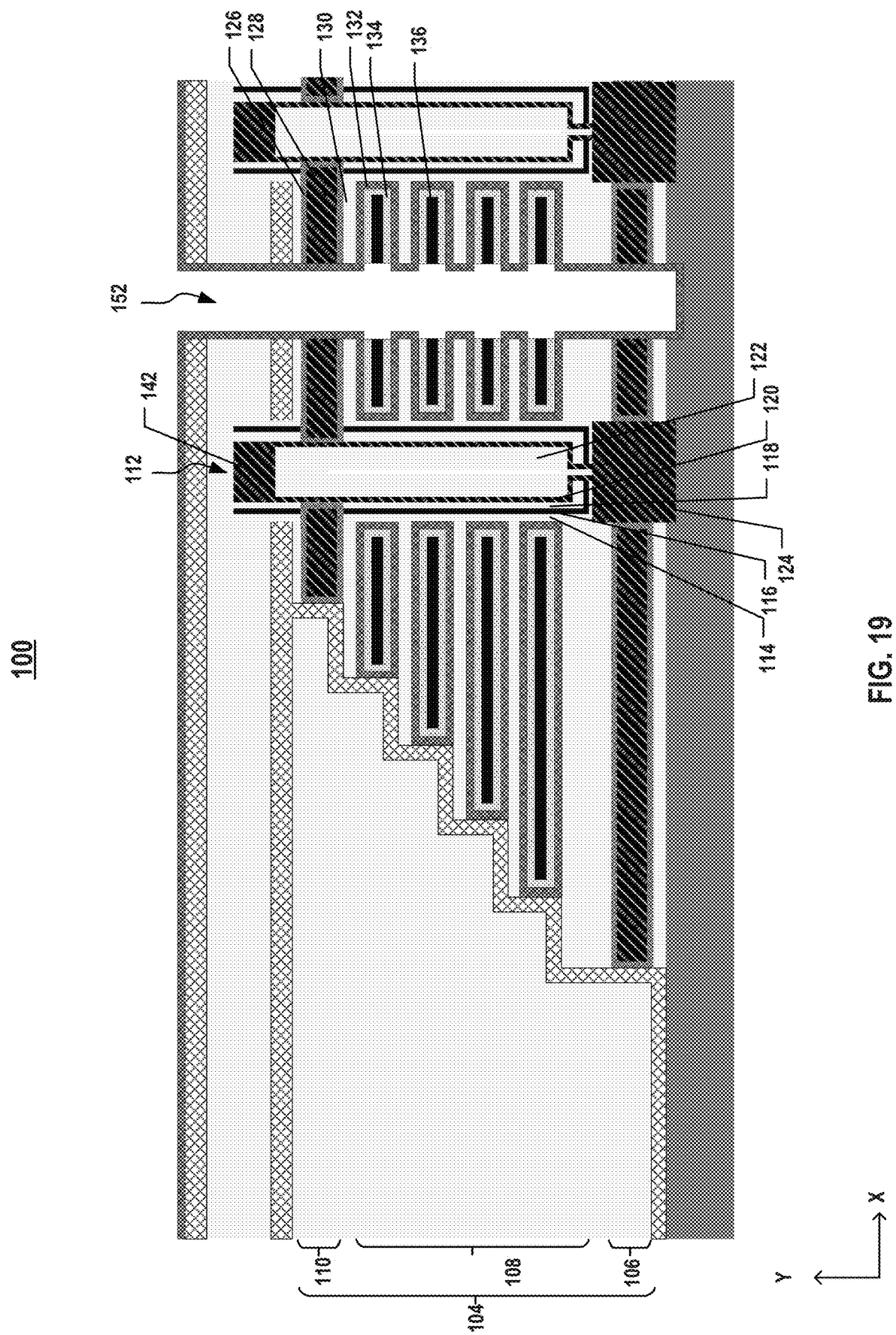

As shown in FIG. 19 and operation 218 of FIG. 21, word lines 108 are formed in cavities 162 in dielectric stack 103. In some implementations, the formation of word lines 108 may include forming gate dielectric layers 132 on the sidewalls of cavities 162, forming adhesion layers 134 on gate dielectric layers 132, and then forming gate conductor 136 on gate dielectric layers 132 filling cavities 162. Gate dielectric layers 132 made include, but not limited to, aluminum oxide (AlO), high-k dielectric materials, or other suitable materials. In some implementations, gate dielectric layers 132 may be formed by ALD, PVD, CVD, or other suitable processes. Adhesion layers 134 may include, but not limited to, Ti/TiN or Ta/TaN. In some implementations, adhesion layers 134 may be formed by ALD, PVD, CVD, or other suitable processes. Gate conductor 136 may include conductive materials including, but not limited to, tungsten (W), cobalt (Co), copper (Cu), aluminum (Al), polysilicon, doped silicon, silicides, or any combination thereof. In some implementations, gate conductor 136 may be formed by ALD, PVD, CVD, or other suitable processes.

Figure 20:
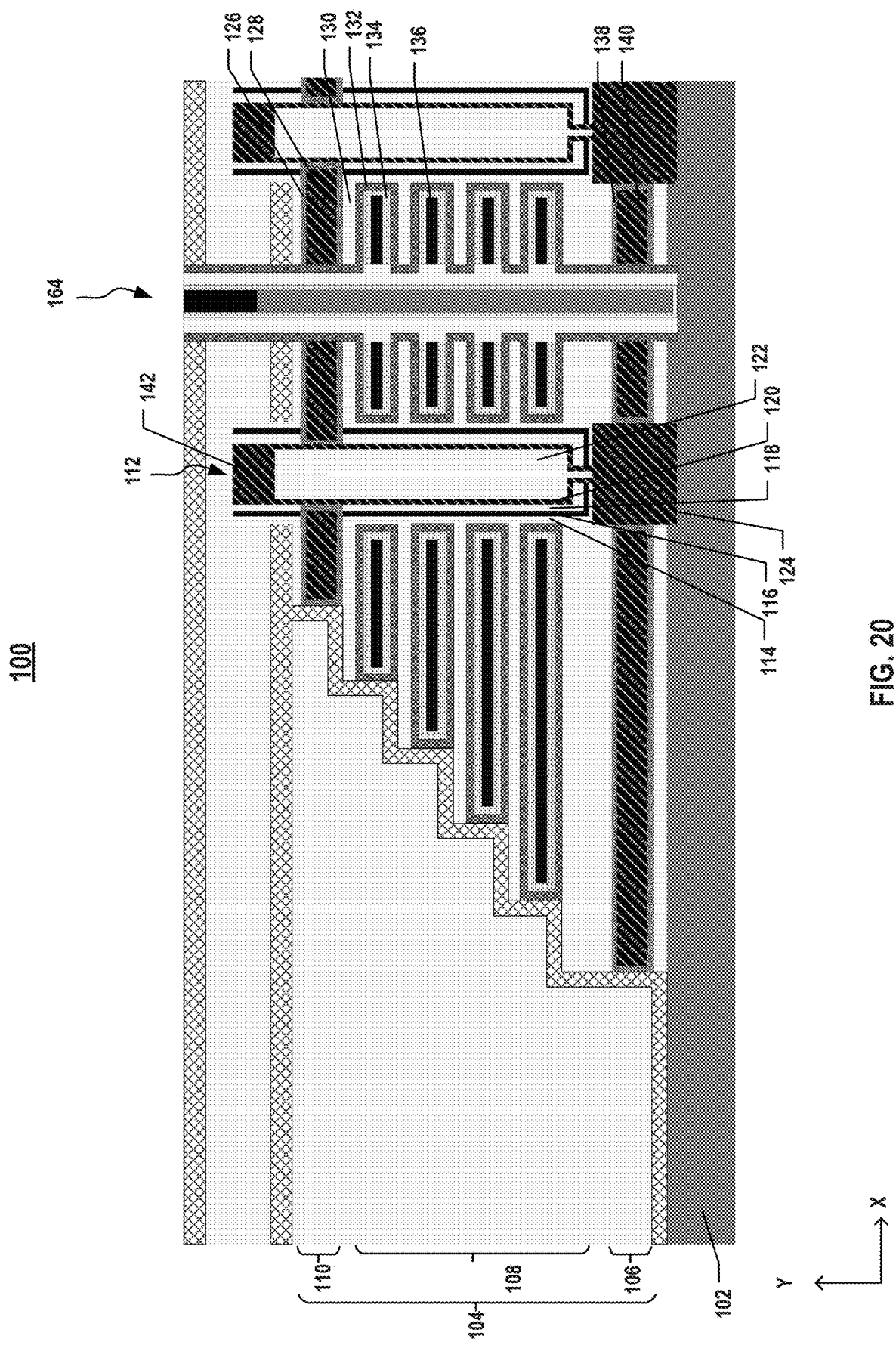
Figure 21:
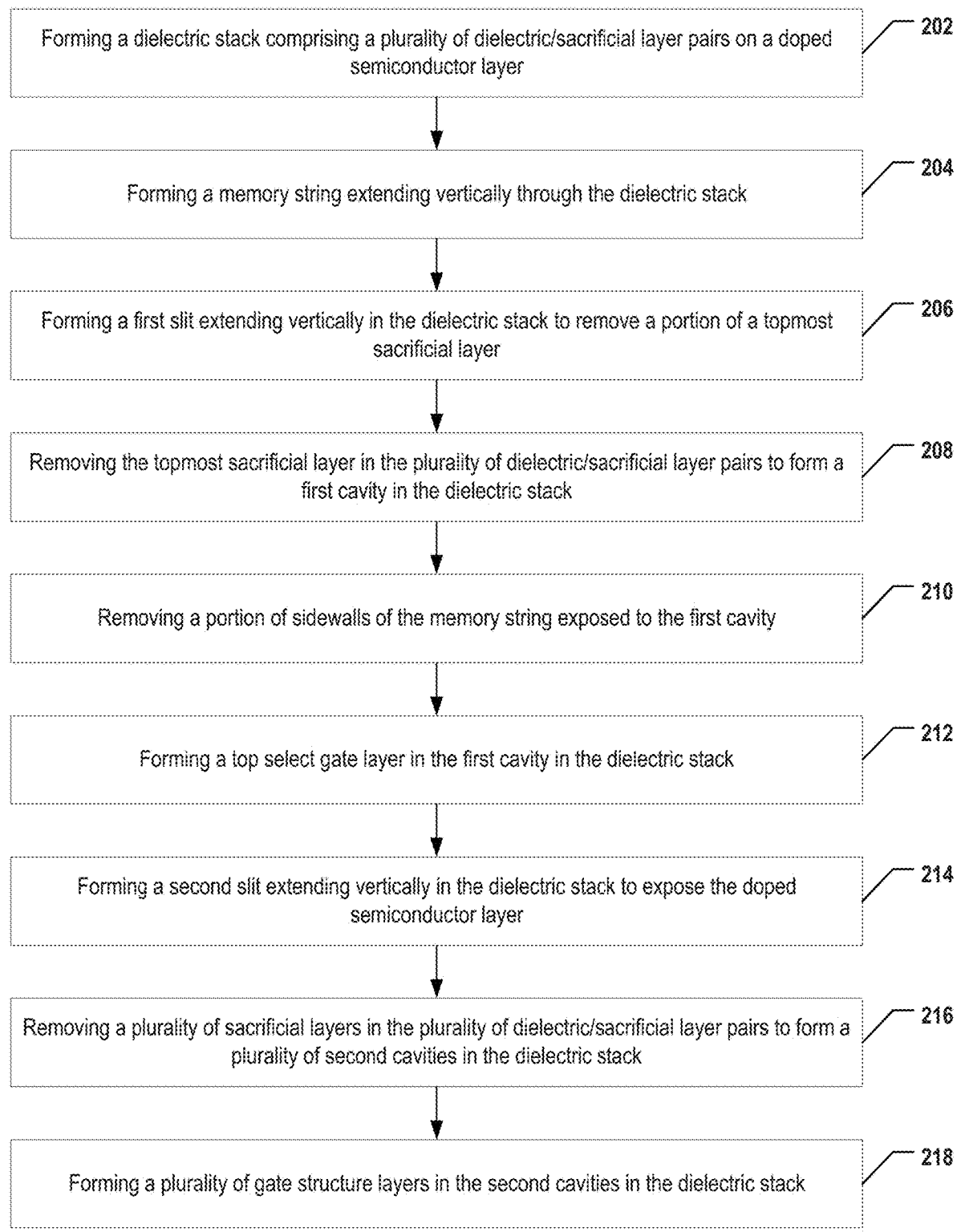
FIG. 21 illustrates a flowchart of an exemplary method for forming a 3D memory device, according to some aspects of the present disclosure.

As shown in FIG. 20, a gate line slit 164 is then formed to fill in second slit 152. In some implementations, the formation of gate line slit 164 may include forming a dielectric spacer layer on sidewalls of second slit 152, forming an adhesion layer on the dielectric spacer layer, forming a polysilicon layer on the adhesion layer, and forming a tungsten plug on the top of the polysilicon layer.

By using the polysilicon material to form drain select gate line 110 or source select gate line 106, the induced threshold voltage (Vt) shift of TSG transistor or the BSG transistor can be prevented. In some implementations, drain select gate line 110 and source select gate line 106 may be both formed by polysilicon material. In some implementations, one of drain select gate line 110 and source select gate line 106 may be formed by polysilicon material.

Figure 22:
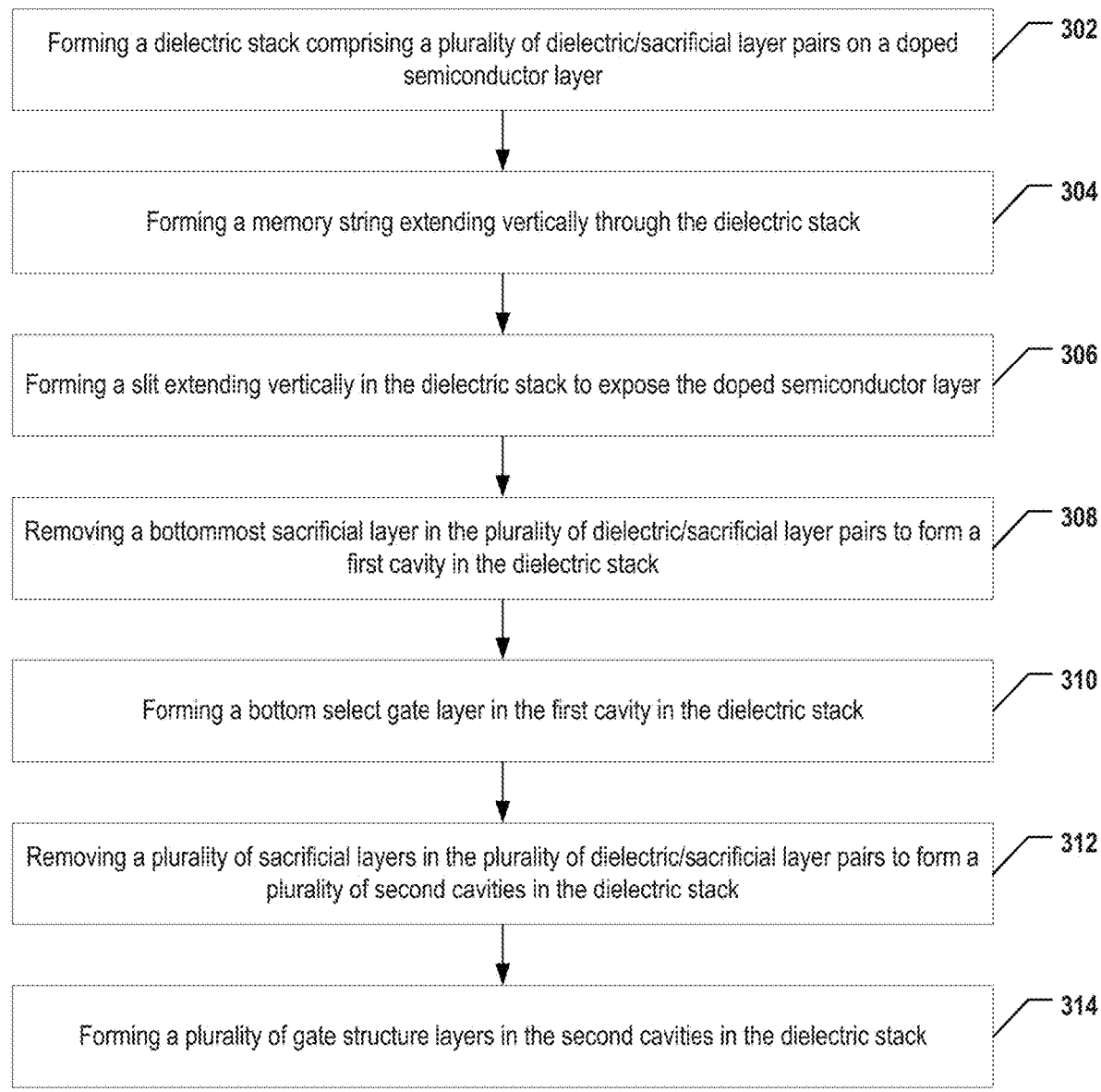
FIG. 22 illustrates a flowchart of another exemplary method for forming a 3D memory device, according to some aspects of the present disclosure.

FIG. 22 illustrates a flowchart of another exemplary method 300 for forming a 3D memory device, according to some aspects of the present disclosure. Method 300 describes the operations to form source select gate line 106 by polysilicon material. As shown in operation 302 of FIG. 22 and FIG. 2, dielectric stack 103 including a plurality of dielectric/sacrificial layer pairs, including dielectric layers 130 and sacrificial layers 144, is formed on substrate 102. Then, as shown in operation 304 of FIG. 22 and FIG. 2, channel structure 112 extending vertically through dielectric stack 103 is formed.

As shown in operation 306 of FIG. 22, a slit extending vertically in dielectric stack 103 is formed to expose substrate 102. In method 300, because only source select gate line 106 is formed in the 3D memory device, the operations described in FIGS. 3-14 may be partially or optionally performed to form second slit 152 exposing substrate 102. Then, as shown in FIG. 15 and operation 308 of FIG. 22, bottommost sacrificial layer 156 in the plurality of dielectric/sacrificial layer pairs is removed to form cavity 160 in dielectric stack 103. Then, as shown in FIG. 16 and operation 310 of FIG. 22, source select gate line 106 is formed in cavity 160 in dielectric stack 103. As shown in FIGS. 17-18 and operation 312 of FIG. 22, sacrificial layers 144 in the plurality of dielectric/sacrificial layer pairs are removed to form a plurality of cavities 162 in dielectric stack 103. Then, as shown in FIG. 19 and operation 314 of FIG. 22, word lines 108 are formed in cavities 162 in dielectric stack 103.

Figure 23:
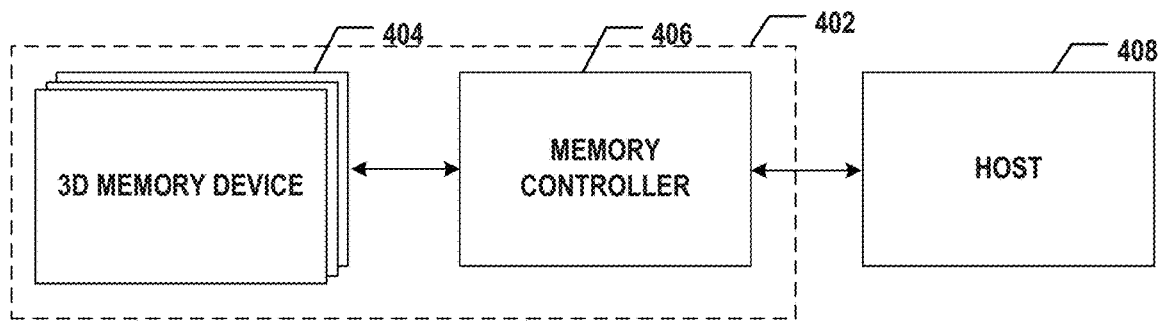
FIG. 23 illustrates a block diagram of an exemplary system having a memory device, according to some aspects of the present disclosure.

FIG. 23 illustrates a block diagram of an exemplary system 400 having a memory device, according to some aspects of the present disclosure. System 400 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 23, system 400 can include a host 408 and a memory system 402 having one or more memory devices 404 and a memory controller 406. Host 408 can be a processor of an electronic device, such as a central processing unit (CPU), or a system-on-chip (SoC), such as an application processor (AP). Host 408 can be configured to send or receive data to or from memory devices 404.

Memory device 404 can be any memory device disclosed in the present disclosure. As disclosed above in detail, memory device 404, such as a NAND Flash memory device, may have a controlled and predefined discharge current in the discharge operation of discharging the bit lines. Memory controller 406 is coupled to memory device 404 and host 408 and is configured to control memory device 404, according to some implementations. Memory controller 406 can manage the data stored in memory device 404 and communicate with host 408. For example, memory controller 406 may be coupled to memory device 404, such as 3D memory device 100 described above, and memory controller 406 may be configured to control operations of channel structure 112 of 3D memory device 100 through drain select gate line 110 and/or select gate line 106. By using the polysilicon material to form drain select gate line 110 and/or source select gate line 106 in 3D memory device 100, the induced threshold voltage (Vt) shift of TSG transistor or the BSG transistor can be prevented. The reliability of memory device 404 can be therefore improved by preventing unpredictable failure caused by the induced threshold voltage (Vt) shift. As a result, the performance of system 400 can be improved.

In some implementations, memory controller 406 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 406 is designed for operating in a high duty-cycle environment SSDs or embedded multi-media-cards (eMMCs) used as data storage for mobile devices, such as smartphones, tablets, laptop computers, etc., and enterprise storage arrays. Memory controller 406 can be configured to control operations of memory device 404, such as read, erase, and program operations. Memory controller 406 can also be configured to manage various functions with respect to the data stored or to be stored in memory device 404 including, but not limited to bad-block management, garbage collection, logical-to-physical address conversion, wear leveling, etc. In some implementations, memory controller 406 is further configured to process error correction codes (ECCs) with respect to the data read from or written to memory device 404. Any other suitable functions may be performed by memory controller 406 as well, for example, formatting memory device 404. Memory controller 406 can communicate with an external device (e.g., host 408) according to a particular communication protocol. For example, memory controller 406 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figures 24A, 24B:
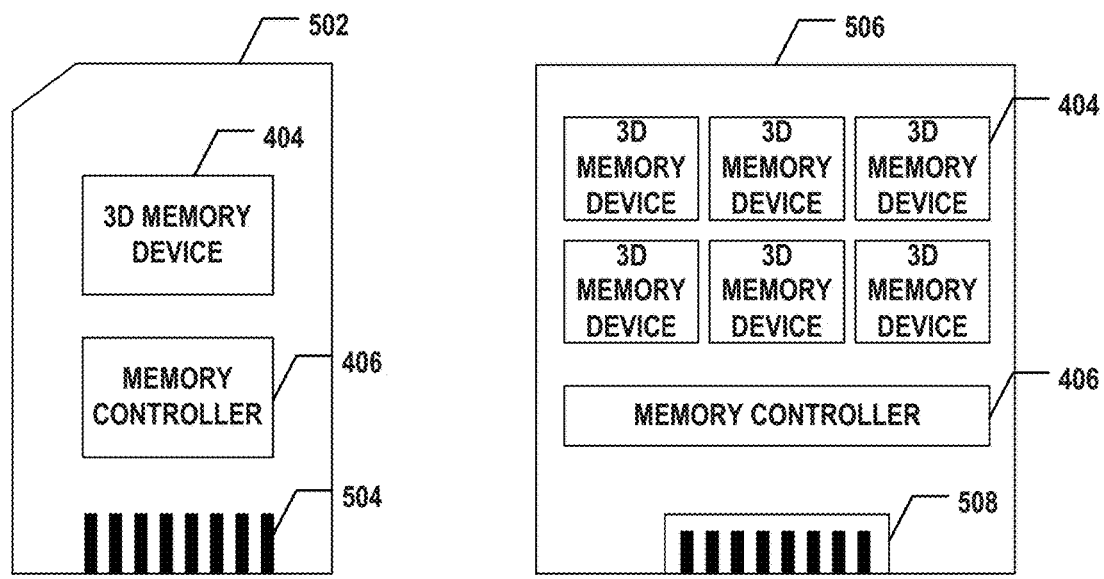
FIG. 24A illustrates a diagram of an exemplary memory card having a memory device, according to some aspects of the present disclosure.
FIG. 24B illustrates a diagram of an exemplary solid-state drive (SSD) having a memory device, according to some aspects of the present disclosure.

Memory controller 406 and one or more memory devices 404 can be integrated into various types of storage devices, for example, be included in the same package, such as a universal Flash storage (UFS) package or an eMMC package. That is, memory system 402 can be implemented and packaged into different types of end electronic products. In one example as shown in FIG. 24A, memory controller 406 and a single memory device 404 may be integrated into a memory card 502. Memory card 502 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 502 can further include a memory card connector 504 coupling memory card 502 with a host (e.g., host 408 in FIG. 23). In another example as shown in FIG. 24B, memory controller 406 and multiple memory devices 404 may be integrated into an SSD 506. SSD 506 can further include an SSD connector 508 coupling SSD 506 with a host (e.g., host 408 in FIG. 23). In some implementations, the storage capacity and/or the operation speed of SSD 506 is greater than those of memory card 502.

According to one aspect of the present disclosure, a 3D memory device is disclosed. The 3D memory device includes a doped semiconductor layer, a stack structure, and a channel structure. The stack structure includes interleaved conductive layers and dielectric layers formed on the doped semiconductor layer. The conductive layers include a plurality of word lines, and a drain select gate line. The channel structure extends through the stack structure along a first direction and is in contact with the doped semiconductor layer. The drain select gate line includes a first dielectric layer in contact with the channel structure, and a first polysilicon layer in contact with the first dielectric layer.

In some implementations, the channel structure includes a semiconductor channel, and a memory film over the semiconductor channel. The first dielectric layer of the drain select gate line is in direct contact with the semiconductor channel. In some implementations, the memory film includes a tunneling layer over the semiconductor channel, a storage layer over the tunneling layer, and a blocking layer over the storage layer. The semiconductor channel, the tunneling layer, the storage layer, and the blocking layer are stacked along a second direction perpendicular to the first direction. In some implementations, the plurality of word lines are in contact with the blocking layer.

In some implementations, each of the plurality of word lines includes a gate dielectric layer, an adhesion layer, and a conductive layer. The gate dielectric layer is in contact with the blocking layer. In some implementations, the conductive layers further include a source select gate line, and the source select gate line includes a second dielectric layer in contact with the channel structure and a second polysilicon layer in contact with the second dielectric layer. In some implementations, the channel structure further includes a channel contact formed beneath the semiconductor channel, the tunneling layer, the storage layer, and the blocking layer, and in contact with the doped semiconductor layer. The source select gate line is in direct contact with the channel contact.

According to another aspect of the present disclosure, a 3D memory device is disclosed. The 3D memory device includes a doped semiconductor layer, a stack structure, and a channel structure. The stack structure includes interleaved conductive layers and dielectric layers formed on the doped semiconductor layer. The conductive layers include a source select gate line, and a plurality of word lines. The channel structure extends through the stack structure along a first direction and is in contact with the doped semiconductor layer. The source select gate line includes a first dielectric layer in contact with the channel structure, and a first polysilicon layer in contact with the first dielectric layer.

In some implementations, the channel structure includes a channel contact formed at a bottom region of the channel structure. The first dielectric layer is in direct contact with the channel contact. In some implementations, the conductive layers further include a drain select gate line, and the drain select gate line includes a second dielectric layer in contact with the channel structure and a second polysilicon layer in contact with the second dielectric layer.

In some implementations, the channel structure further includes a semiconductor channel, a tunneling layer over the semiconductor channel, a storage layer over the tunneling layer, and a blocking layer over the storage layer. The second dielectric layer of the drain select gate line is in direct contact with the semiconductor channel. In some implementations, the semiconductor channel, the tunneling layer, the storage layer, and the blocking layer are stacked along a second direction perpendicular to the first direction.

According to still another aspect of the present disclosure, a system is disclosed. The system includes a 3D memory device configured to store data and a memory controller. The 3D memory device includes a doped semiconductor layer, a stack structure, and a channel structure. The stack structure includes interleaved conductive layers and dielectric layers formed on the doped semiconductor layer. The conductive layers include a source select gate line, a plurality of word lines, and a drain select gate line. The channel structure extends through the stack structure along a first direction and is in contact with the doped semiconductor layer. The drain select gate line includes a first dielectric layer in contact with the channel structure, and a first polysilicon layer in contact with the first dielectric layer. The memory controller is coupled to the 3D memory device and is configured to control operations of the channel structure through the drain select gate line.

According to yet another aspect of the present disclosure, a system is disclosed. The system includes a 3D memory device configured to store data and a memory controller. The 3D memory device includes a doped semiconductor layer, a stack structure, and a channel structure. The stack structure includes interleaved conductive layers and dielectric layers formed on the doped semiconductor layer. The conductive layers include a source select gate line, a plurality of word lines, and a drain select gate line. The channel structure extends through the stack structure along a first direction and is in contact with the doped semiconductor layer. The source select gate line includes a first dielectric layer in contact with the channel structure, and a first polysilicon layer in contact with the first dielectric layer. The memory controller is coupled to the 3D memory device and is configured to control operations of the channel structure through the source select gate line.

According to yet another aspect of the present disclosure, a method for forming a 3D memory device is disclosed. A dielectric stack including a plurality of dielectric/sacrificial layer pairs is formed on a doped semiconductor layer. A channel structure is formed extending vertically through the dielectric stack. A first slit extending vertically in the dielectric stack is formed to remove a portion of a topmost sacrificial layer. The topmost sacrificial layer in the plurality of dielectric/sacrificial layer pairs is removed to form a first cavity in the dielectric stack. A portion of sidewalls of the channel structure exposed to the first cavity is removed. A drain select gate line is formed in the first cavity in the dielectric stack. A second slit extending vertically in the dielectric stack is formed to expose the doped semiconductor layer. A plurality of sacrificial layers in the plurality of dielectric/sacrificial layer pairs are removed to form a plurality of second cavities in the dielectric stack. A plurality of word lines are formed in the second cavities in the dielectric stack.

In some implementations, a bottommost sacrificial layer in the plurality of dielectric/sacrificial layer pairs is removed to form a third cavity in the dielectric stack, and a source select gate line is formed in the third cavity in the dielectric stack. In some implementations, the channel structure includes a semiconductor channel, a tunneling layer over the semiconductor channel, a storage layer over the tunneling layer, and a blocking layer over the storage layer.

In some implementations, the blocking layer, the storage layer, and the tunneling layer of the channel structure exposed to the first cavity are removed, and the channel layer is exposed. In some implementations, the drain select gate line is formed in the first cavity in direct contact with the semiconductor channel. In some implementations, a first dielectric layer is formed on sidewalls of the first cavity in direct contact with the semiconductor channel, and a first polysilicon layer is formed in the first cavity.

In some implementations, the first slit is vertically extended to form the second slit to expose the doped semiconductor layer. In some implementations, the channel structure further includes a channel contact formed beneath the semiconductor channel, the tunneling layer, the storage layer, and the blocking layer, and in contact with the doped semiconductor layer. In some implementations, a second dielectric layer is formed on sidewalls of the third cavity in contact with the channel contact, and a second polysilicon layer is formed in the third cavity.

According to yet another aspect of the present disclosure, a method for forming a 3D memory device is disclosed. A dielectric stack including a plurality of dielectric/sacrificial layer pairs is formed on a doped semiconductor layer. A channel structure extending vertically through the dielectric stack is formed. A slit extending vertically in the dielectric stack is formed to expose the doped semiconductor layer. A bottommost sacrificial layer in the plurality of dielectric/sacrificial layer pairs is removed to form a first cavity in the dielectric stack. A source select gate line is formed in the first cavity in the dielectric stack. A plurality of sacrificial layers in the plurality of dielectric/sacrificial layer pairs are removed to form a plurality of second cavities in the dielectric stack. A plurality of word lines are formed in the second cavities in the dielectric stack.

In some implementations, a first dielectric layer is formed on sidewalls of the first cavity in contact with the channel structure, and a first polysilicon layer is formed in the first cavity. In some implementations, the channel structure includes a channel contact formed at a bottom region of the channel structure, and the first dielectric layer is in direct contact with the channel contact.

In some implementations, a first slit is formed extending vertically in the dielectric stack to remove a portion of a topmost sacrificial layer, the topmost sacrificial layer in the plurality of dielectric/sacrificial layer pairs is removed to form a third cavity in the dielectric stack, a portion of sidewalls of the channel structure exposed to the third cavity is removed, a drain select gate line is formed in the third cavity in the dielectric stack, and a second slit is formed extending vertically in the dielectric stack to expose the doped semiconductor layer.

In some implementations, the blocking layer, the storage layer, and the tunneling layer of the channel structure exposed to the third cavity are removed, and the semiconductor channel is exposed. In some implementations, the drain select gate line is formed in the third cavity in direct contact with the semiconductor channel. In some implementations, a second dielectric layer is formed on sidewalls of the third cavity in direct contact with the semiconductor channel, and a second polysilicon layer is formed in the third cavity.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
a doped semiconductor layer;
a stack structure comprising interleaved conductive layers and dielectric layers formed on the doped semiconductor layer, the conductive layers comprising a plurality of word lines, and a drain select gate line; and
a channel structure comprising a semiconductor channel and a memory film over the semiconductor channel, the channel structure extending through the stack structure along a first direction and in contact with the doped semiconductor layer,
wherein the drain select gate line comprises a first dielectric layer in direct contact with the semiconductor channel of the channel structure, and a first polysilicon layer in contact with the first dielectric layer.

2. The 3D memory device of claim 1, wherein the memory film comprises:
a tunneling layer over the semiconductor channel;
a storage layer over the tunneling layer; and
a blocking layer over the storage layer,
wherein the semiconductor channel, the tunneling layer, the storage layer, and the blocking layer are stacked along a second direction perpendicular to the first direction.

3. The 3D memory device of claim 2, wherein the plurality of word lines are in contact with the blocking layer.

4. The 3D memory device of claim 2, wherein each of the plurality of word lines comprises a gate dielectric layer, an adhesion layer, and a conductive layer, wherein the gate dielectric layer is in contact with the blocking layer.

5. The 3D memory device of claim 1, wherein the conductive layers further comprise a source select gate line, and the source select gate line comprises a second dielectric layer in contact with the channel structure and a second polysilicon layer in contact with the second dielectric layer.

6. The 3D memory device of claim 5, wherein the channel structure further comprises:
a channel contact formed beneath the semiconductor channel, and in contact with the doped semiconductor layer,
wherein the source select gate line is in direct contact with the channel contact.

7. The 3D memory device of claim 1, wherein:
the plurality of word lines comprise a first word line comprising a first gate dielectric layer, and a second word line comprising a second gate dielectric layer; and
the first gate dielectric layer and the second gate dielectric layer are connected.

8. The 3D memory device of claim 7, wherein:
the first gate dielectric layer and the second gate dielectric layer comprise a same material.

9. The 3D memory device of claim 1, wherein:
the memory film comprises a blocking layer; and
one word line of the plurality of word lines comprises a gate dielectric layer, the gate dielectric layer being in contact with the blocking layer.

10. The 3D memory device of claim 1, wherein:
the memory film comprises a blocking layer; and
the blocking layer is discontinuous at the drain select gate line.

11. The 3D memory device of claim 1, wherein the memory film comprises:
a tunneling layer over the semiconductor channel;
a storage layer over the tunneling layer; and
a blocking layer over the storage layer,
wherein the drain select gate line extends in a second direction perpendicular to the first direction to break the tunnel layer, the storage layer, and the blocking layer to be in direct contact with the semiconductor channel.

12. A three-dimensional (3D) memory device, comprising:
a doped semiconductor layer;
a stack structure comprising interleaved conductive layers and dielectric layers formed on the doped semiconductor layer, the conductive layers comprising a source select gate line, and a plurality of word lines; and
a channel structure comprising a channel contact formed at a bottom region of the channel structure, the channel structure extending through the stack structure along a first direction and in contact with the doped semiconductor layer,
wherein the source select gate line comprises a first dielectric layer in direct contact with the channel contact of the channel structure, and a first polysilicon layer in contact with the first dielectric layer.

13. The 3D memory device of claim 12, wherein the conductive layers further comprise a drain select gate line, and the drain select gate line comprises a second dielectric layer in contact with the channel structure and a second polysilicon layer in contact with the second dielectric layer.

14. The 3D memory device of claim 13, wherein the channel structure further comprises:
a semiconductor channel;
a tunneling layer over the semiconductor channel;
a storage layer over the tunneling layer; and
a blocking layer over the storage layer,
wherein the second dielectric layer of the drain select gate line is in direct contact with the semiconductor channel.

15. The 3D memory device of claim 14, wherein the semiconductor channel, the tunneling layer, the storage layer, and the blocking layer are stacked along a second direction perpendicular to the first direction.

16. The 3D memory device of claim 12, wherein:
the channel contact comprises silicon.

17. The 3D memory device of claim 12, wherein:
a material of the source select gate line is different from a material of each of the plurality of word lines.

18. A three-dimensional (3D) memory device, comprising:
a doped semiconductor layer;
a stack structure comprising interleaved conductive layers and dielectric layers formed over the doped semiconductor layer, the conductive layers comprising a plurality of word lines and a drain select gate line; and
a channel structure comprising a semiconductor channel and a memory film over the semiconductor channel, and extending through the stack structure along a first direction to be in contact with the doped semiconductor layer,
wherein:
the drain select gate line extends in a second direction perpendicular to the first direction and extends through a first portion of the memory film to be in direct contact with the semiconductor channel; and
one word line of the plurality of word lines extends in the second direction and is in contact with a second portion of the memory film.

19. The 3D memory device of claim 18, wherein:
the memory film comprises a tunneling layer, a storage layer, and a blocking layer arranged in this order from the semiconductor channel; and
the drain select gate line penetrates the tunneling layer, the storage layer, and the blocking layer to be in direct contact with the semiconductor channel.

20. The 3D memory device of claim 18, wherein:
the memory film comprises a tunneling layer, a storage layer, and a blocking layer arranged in this order from the semiconductor channel; and
the tunneling layer, the storage layer, and the blocking layer are discontinuous at the drain select gate line.

* * * * *